United States Patent
Hilarius et al.

(10) Patent No.: US 10,668,733 B2
(45) Date of Patent: Jun. 2, 2020

(54) RECEPTACLE COMPRISING A FORMULATION CONTAINING AT LEAST ONE ORGANIC SEMICONDUCTOR

(71) Applicant: Merck Patent GmbH, Darmstadt (DE)

(72) Inventors: Volker Hilarius, Gross-Umstadt (DE); Edgar Boehm, Griesheim (DE); Juliane Suermann, Darmstadt (DE); Mark John Goulding, Ringwood (GB); Leticia Garcia Diez, Darmstadt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 16/084,793

(22) PCT Filed: Mar. 10, 2017

(86) PCT No.: PCT/EP2017/055641
§ 371 (c)(1),
(2) Date: Sep. 13, 2018

(87) PCT Pub. No.: WO2017/157783
PCT Pub. Date: Sep. 21, 2017

(65) Prior Publication Data
US 2019/0084309 A1    Mar. 21, 2019

(30) Foreign Application Priority Data
Mar. 15, 2016    (DE) .................. 10 2016 003 104

(51) Int. Cl.
| | | |
|---|---|---|
| *B41J 2/175* | (2006.01) | |
| *H01L 51/00* | (2006.01) | |
| *B01J 20/22* | (2006.01) | |
| *H01L 51/05* | (2006.01) | |
| *H01L 51/50* | (2006.01) | |

(52) U.S. Cl.
CPC ........... *B41J 2/17513* (2013.01); *B01J 20/22* (2013.01); *B41J 2/175* (2013.01); *H01L 51/0019* (2013.01); *H01L 51/0537* (2013.01); *H01L 51/5024* (2013.01); *H01L 51/5072* (2013.01); *Y02C 10/08* (2013.01)

(58) Field of Classification Search
CPC ........ B41J 2/17513; B41J 2/175; B01J 20/22
See application file for complete search history.

(56) References Cited

U.S. PATENT DOCUMENTS

| | | | |
|---|---|---|---|
| 2004/0072923 A1 | 4/2004 | Matsunami et al. | |
| 2005/0281723 A1* | 12/2005 | Carre | B01D 53/62 423/220 |
| 2007/0109368 A1* | 5/2007 | Kimura | B41J 2/17566 347/86 |
| 2011/0175078 A1* | 7/2011 | Kim | C01B 3/503 257/40 |
| 2014/0319181 A1* | 10/2014 | Tremel | B65D 83/0094 222/389 |

FOREIGN PATENT DOCUMENTS

| | | |
|---|---|---|
| CN | 103956407 A | 7/2014 |
| JP | 2004149765 A | 5/2004 |

OTHER PUBLICATIONS

International Search Report for PCT/EP2017/055641 dated May 15, 2017.
Written Opinion of the International Searching Authority for PCT/EP2017/055641 dated May 15, 2017.

\* cited by examiner

*Primary Examiner* — Jason S Uhlenhake
(74) *Attorney, Agent, or Firm* — Faegre Drinker Biddle & Reath LLP

(57) ABSTRACT

The present invention relates to vessels comprising a formulation including at least one organic semiconductor, wherein the formulation is in contact with at least one absorption material. The invention further describes a process for producing the vessel and for the use thereof.

19 Claims, No Drawings

RECEPTACLE COMPRISING A FORMULATION CONTAINING AT LEAST ONE ORGANIC SEMICONDUCTOR

CROSS-REFERENCE TO RELATED APPLICATIONS

This application is a national stage application (under 35 U.S.C. § 371) of PCT/EP2017/055641, filed Mar. 10, 2017, which claims benefit of German Application No. 10 2016 003 104.2, filed Mar. 15, 2016, both of which are incorporated herein by reference in their entirety.

The present invention relates to a vessel comprising a formulation including at least one organic semiconductor and to a process for producing the vessel and to a use thereof.

In printed electronics, sensitive organic and inorganic components are used and are applied to carrier materials by printing methods. High-resolution printing methods are used here to a particular degree, such as inkjet printing, screen printing, pad printing or else other relief and intaglio printing methods. For these printing methods, the provision of printing inks or printing pastes in suitable exchangeable reservoir vessels and cartridges is customary. For this purpose, it is customary to use metal or plastic vessels which, for protection of sensitive materials, frequently also additionally include multilayer inliner pouches. The inliner pouch achieves filling without excess air and emptiability, and additionally protects the material from diffusion of atmospheric oxygen, water and/or other impurities by virtue of the multilayer pouch film.

However, the printing inks thus packaged feature a limited shelf life, and it is only possible to determine the quality of the inks in the product produced thereby. It is a particular problem here that certain batches or vessels lead to a lower quality of the electronic devices produced, whereas other cartridges which have been stored or transported over a similar long period have an acceptable quality of the electronic devices produced.

The problem addressed by the present invention was therefore that of providing vessels for formulations, preferably ink reservoir vessels, more preferably ink cartridges, in which the formulation present is protected from premature degradation of quality, for example from contaminants which can penetrate into the vessel. A further problem addressed is that of increasing the security and reliability of vessels for formulations including at least one organic semiconductor to the effect that the inks lead to a high quality of the electronic devices produced even after a prolonged period of storage.

It has been found that, surprisingly, the degradation in quality of formulation including at least one organic semiconductor can be significantly lowered though the use of at least one absorption material in contact with the formulation. In this way, it is possible to store and transport printing inks for long periods without any lowering in the quality of the electronic devices obtained by means of these inks. In addition, the vessels of the invention have high reliability.

The present invention thus provides a vessel comprising a formulation including at least one organic semiconductor, which is characterized in that the formulation is in contact with at least one absorption material.

The term "printing inks" or "inks" in the present application also includes printing pastes. Rather than the terms "printing ink" or "ink", the term "solution" or "formulation" is also used synonymously in the present application.

The vessel chosen to accommodate a formulation is not subject to any particular restriction and may therefore be configured for transport, for storage and/or for use as a cartridge. What is essential here is that permeability to substances which can lead to impairment of the quality of the formulation should be at a minimum. Preferably, the vessel takes the form of a printer cartridge and can accordingly be inserted into an appropriately configured printer.

The size, shape and configuration of the ink reservoir vessel of the invention or the ink cartridge of the invention is accordingly not restricted in any way. Instead, it is possible in accordance with the invention to use any known reservoir vessels or cartridges suitable for the storage of the inks used in accordance with the invention, i.e. formulations containing at least one organic semiconductor in at least one solvent.

Suitable absorption materials for the formulations used in accordance with the invention are all materials that can absorb and/or chemically bind oxygen, water, carbon dioxide and/or other contamination components, for example hydroxide ions. Preferred absorption materials, also referred to herein as getter materials, for the formulations used in accordance with the invention are compounds that, within the temperature range from −40° C. to 200° C., preferably within a temperature range from 10° C. to 50° C., more preferably at room temperature and hence storage temperature, are hydrolysed, absorb water, carbon dioxide or oxygen and/or break down or are chemically converted with absorption of water, oxygen, halogens and/or carbon dioxide.

It may preferably be the case that the absorption and/or reaction rate of the absorption material with oxygen, water, carbon dioxide and/or hydroxide ions is much higher than the reaction rate of oxygen, water, carbon dioxide and/or hydroxide ions with the organic semiconductor present in the formulation.

Particularly preferred getter materials are alkali metals or alkaline earth metals, for example Ca, Ba, Sr, Mg, Li, Na and K, or the oxides thereof; aluminium oxide, titanium oxide or zirconium oxide, silicon oxide, high-porosity or nanoparticulate oxides, zeolites, silica gels or aluminosilicates; transition metals, for example zirconium, vanadium, cobalt, iron, manganese, copper and zinc, or the oxides thereof, and combinations, mixtures or alloys of these materials, for example silica gels which have been enriched with alkali metals or alkaline earth metals. The absorption materials mentioned can be used individually or as a mixture of 2, 3, 4 or more. For instance, materials used may include those which are used as getters for generation of vacuum, and mention may be made by way of example of the alloys St 707 (70% zirconium, 24.6% vanadium and 5.6% iron), St 787 (80.8% zirconium, 14.2% cobalt and 5.0% cerium mischmetal) and St 101 (84% zirconium and 16% aluminium).

The at least one absorption material can be introduced in any known manner into the vessel for use in accordance with the invention. For example, the absorption material may take the form of a film, a powder, a granular material, preferably having particle sizes in the range from 1 µm to 5 mm, more preferably 100 µm to 1 mm, and/or of a shaped body, preferably a sheet, a rod or a tablet. The absorption material here may be solid, porous or particulate. The dimension of the film or the shaped body may be chosen in accordance with the requirements, and is preferably not less than 1 mm, more preferably not less than 10 mm, in the greatest extent.

The absorption material is in contact with the formulation including at least one organic semiconductor. It may be the case here that the absorption material is in direct contact with the formulation. In this context, "directly" means that the surface of the absorption material is in direct contact with the formulation, i.e. is not encased or introduced into a container. Accordingly, the absorption material can be added directly to the formulation.

Surprising advantages can be achieved by virtue of the absorption material being embedded into a polymer material, preferably a polymer film or a polymer coating. This configuration can surprisingly enhance the transportability of the vessels with retention of the quality of the formulation. More particularly, these vessels can also be used for storage and for transport of inks suitable for production of high-resolution displays and fine-structured electronics. For instance, the inks stored in the vessels, even after being transported, show a surprisingly low fines content which can lead to impairment of the electronic devices obtained from the formulations.

The manner in which the absorption material is embedded into the polymer material is not subject to any particular restriction. According to the requirement, the polymer material, preferably the polymer film, may include the absorption material in such a way that polymer material and absorption material are in a mixture. Preferably, the absorption material can be distributed homogeneously within the polymer material, preferably the polymer film. This configuration can achieve easy metering and handling of the absorption material.

It may also be the case that the polymer material, preferably the polymer film, surrounds the absorption material, such that the polymer film forms a pouch, container or shell within which the absorption material is present. This configuration features particularly high stability compared to release of particles into the formulation, which is maintained even over the course of prolonged transport. The polymer material here may have pores, but the pores should be kept as small as possible in order to prevent particles of the absorption material from getting into the formulation. The pores are preferably smaller than 0.1 µm; more preferably, essentially no pores are present in the polymer material.

In addition, a mixture of polymer material and absorption material can be introduced into a pouch, a vessel or a shell, so as to give a combination of the embodiments detailed above.

It may also be the case that the polymer material, preferably the polymer film, preferably has a thickness in the range from 10 nm to 500 µm, preferably in the range from 50 nm to 200 µm, particularly in the range from 0.1 µm to 100 µm.

Preferably, the polymer material, more preferably the polymer film, may have a permeability to oxygen, water, carbon dioxide and/or hydroxide ions of at least 0.001 g/(m² d) (g per square metre and day), measured by means of diffusion measurement at 25° C. The test methodology is described at www.mocontesting.com and can be effected, for example, in accordance with ASTM E96, ASTM E398, ASTM F1249, ASTM D6701, Tappi T557, Tappai T523, ISO 15106, JIS K7129, ASTM D3985, ASTM F1307, ASTM F2622-8 and/or ASTM F1927, it being possible in each case to use the version of the standard that was valid on 11 Feb. 2016.

It may also be the case that the polymer material, preferably the polymer film, comprises a polyolefin, preferably polyethylene (LDPE, HDPE) or polypropylene, or a fluorinated polymer, preferably perfluoroalkoxy polymers (PFA, Teflon), polyvinylidene fluoride (PVDF, Kynar) or polytetrafluoroethylene (PTFE). More preferably, it is possible, for example, to use a PTFE available under the Goretex™ name.

The weight ratio of polymer material to absorption material can be chosen within a wide range, the proportion being dependent on the mode of introduction of the absorption material and the stability requirements. For an improvement in the dosage and handling, relatively small amounts of polymer material are sufficient; if an improvement in transport capacity is the aim, greater proportions of polymer material may be appropriate. Preferably, the weight ratio of absorption material to polymer material, preferably polymer film, may be in the range from 500:1 to 1:500, preferably 100:1 to 1:100, especially preferably 10:1 to 1:10.

In a preferred configuration, the vessel may be configured as a printer cartridge, preferred printer cartridges having a housing into which there has been introduced an inner pouch within which the formulation including at least one organic semiconductor is present.

The inner pouch preferably present within the printer cartridge may be formed from a multilayer film impermeable to oxygen, water, carbon dioxide and/or hydroxide ions. "Impermeable" means here that the permeability of these films to oxygen, water and/or carbon dioxide is less than 0.00001 g/(m² d), preferably less than $10^{-6}$ g/(m² d), measured by means of diffusion measurements at 25° C. The impermeability of a multilayer film can be achieved especially through the use of a metal film which may preferably have a thickness in the range from 20 µm to 100 µm, more preferably 40 µm to 60 µm.

It may also be the case that the inner pouch which may be present within the printer cartridge has structures which ensure complete emptying of the inner pouch. These structures can be produced, for example, by means of welding sites.

In a particular configuration, a layer comprising an absorption material may be applied at least to part of the inner surface of the inner pouch and/or the absorption material may be introduced into an inner layer of the inner pouch.

In addition, the absorption material may be part of a layer of the pouch to which a further layer is applied, such that a layer of the inner pouch that does not comprise any absorption material is provided between the absorption material and the formulation. In this case, this layer should have a high permeability to the substances to be absorbed.

It may additionally be the case that the printer cartridge has a valve, in which case the absorption material is fixed close to the valve. In this case, the absorption material may preferably be introduced into a polymer film, pouch, vessel or shell which has been bonded and preferably welded to the valve. Through this configuration, it is possible to ensure a particularly simple and appropriate introduction of the absorption material.

A vessel of the invention comprises a formulation, where the formulation may be a solution, dispersion or suspension in which one or more organic semiconductors have been dissolved or dispersed in a solvent or dispersant.

In this case, the formulation may include customary solvents or dispersants, each of which is chosen as a function of the organic semiconductors and the printing method.

For instance, the formulation may comprise a solvent or dispersants selected from alcohols, aldehydes, ketones, ethers, esters, amides, sulphur compounds, nitro compounds, hydrocarbons, halogenated hydrocarbons, aromatic or heteroaromatic hydrocarbons, halogenated aromatic or heteroaromatic hydrocarbons, siloxanes and mixtures of these compounds, preferably ketones, esters, amides, sulphur compounds, nitro compounds, halogenated hydrocarbons and hydrocarbons. Aromatic and heteroaromatic hydrocarbons, di-$C_{1-2}$-alkylformamides and chlorinated hydrocarbons are particularly preferred organic solvents.

Particularly preferred organic solvents or dispersants are, for example, 1,2,3,4-tetramethylbenzene, 1,2,3,5-tetramethylbenzene, 1,2,3-trimethylbenzene, 1,2,4,5-tetramethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, thianaphthalene, 1-bromonaphthalene, 1-chloromethylnaphthalene, 1-ethylnaphthalene, 1-methoxynaphthalene, 1-methylnaphthalene, 1-methylindole, 2,3-benzofuran, 2,3-dihydrobenzofuran, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaphthalene, 2-ethylnaphthalene, 2-isopropylanisole, 2-methylanisole, 2-methylindole, 3,4-dimethylanisole, 3,5-dimethylanisole, 3-bromoquinoline, 3-methylanisole, 4-methylanisole, 5-decanolide, 5-methoxyindane, 5-methoxyindole, 5-tert-butyl-m-xylene, 6-methylquinoline, 8-methylquinoline, acetophenone, anisole, benzonitrile, benzothiazole, benzyl acetate, bromobenzene, butyl benzoate, butyl phenyl ether, cyclohexylbenzene, decahydronaphthol, dimethoxytoluene, diphenyl ether, propiophenone, ethylbenzene, ethyl benzoate, γ-terpinene, hexylbenzene, indane, indene, isochromane, cumene, m-cymene, mesitylene, methyl benzoate, o-, m-, p-xylene, propyl benzoate, propylbenzene, o-dichlorobenzene, pentylbenzene, phenetole, ethoxybenzene, phenyl acetate, p-cymene, propiophenone, sec-butylbenzene, t-butylbenzene, thiophene, toluene, veratrole, monochlorobenzene, o-dichlorobenzene, pyridines, pyrazines, pyrimidines, pyrrolidinones, morpholine, dimethylacetamide, dimethyl sulphoxide, decalin, phenoxytoluene, especially 3-phenoxytoluene, tetrahydrofuran (THF), methyl-THF, tetrahydropyran (THP), cyclohexanone and/or mixtures of these compounds.

The solvents or dispersants can be used individually or as a mixture of two, three or more compounds. Preferably, the absorption material can be chosen in accordance with the solvent or dispersant used, such that no reaction occurs between the solvent or dispersant and absorption material. Optionally, the absorption material can be encased or embedded in such a way that it is separated from the solvent or dispersant.

A formulation usable in accordance with the invention further comprises at least one organic semiconductor preferably selected from host materials, matrix materials, electron transport materials, electron injection materials, hole conductor materials, hole injection materials, electron blocker materials and hole blocker materials.

The organic semiconductor material may be a compound having a low molecular weight, a polymer, an oligomer or a dendrimer, where the organic semiconductor material may also take the form of a mixture. For instance, the formulations usable in accordance with the invention may comprise two different compounds having a low molecular weight, one compound having a low molecular weight and one polymer or two polymers (blend).

Organic semiconductor materials are in many cases described in terms of the properties of the interface orbitals which are detailed hereinafter. Molecular orbitals, especially also the highest occupied molecular orbital (HOMO) and the lowest unoccupied molecular orbital (LUMO), the energy levels thereof and the energy of the lowest triplet state $T_1$ and that of the lowest excited singlet state $S_1$ of the materials are determined via quantum-chemical calculations. For calculation of organic substances without metals, an optimization of geometry is first conducted by the "Ground State/Semiempirical/Default Spin/AM1/Charge 0/Spin Singlet" method. Subsequently, an energy calculation is effected on the basis of the optimized geometry. This is done using the "TD-SCF/DFT/Default Spin/B3PW91" method with the "6-31G(d)" basis set (charge 0, spin singlet). For metal-containing compounds, the geometry is optimized via the "Ground State/Hartree-Fock/Default Spin/LanL2MB/Charge 0/Spin Singlet" method. The energy calculation is effected analogously to the above-described method for the organic substances, except that the "LanL2DZ" basis set is used for the metal atom and the "6-31G(d)" basis set for the ligands. The HOMO energy level HEh or LUMO energy level LEh is obtained from the energy calculation in Hartree units. This is used to determine the HOMO and LUMO energy levels in electron volts, calibrated by cyclic voltammetry measurements, as follows:

HOMO(eV)=((*HEh*\*27.212)−0.9899)/1.1206

LUMO(eV)=((*LEh*\*27.212)−2.0041)/1.385

These values are to be regarded as HOMO and LUMO energy levels of the materials in the context of this application.

The lowest triplet state $T_1$ is defined as the energy of the triplet state having the lowest energy, which is apparent from the quantum-chemical calculation described.

The lowest excited singlet state $S_1$ is defined as the energy of the excited singlet state having the lowest energy, which is apparent from the quantum-chemical calculation described.

The method described herein is independent of the software package used and always gives the same results. Examples of frequently utilized programs for this purpose are Gaussian09W (Gaussian Inc.) and Q-Chem 4.1 (Q-Chem, Inc.).

Compounds having hole injection properties, also called hole injection materials herein, facilitate or enable the transfer of holes, i.e. positive charges, from the anode into an organic layer. In general, a hole injection material has a HOMO level which is in the region of the level of the anode or higher, i.e. generally at least −5.3 eV.

Compounds having hole transport properties, also called hole transport materials herein, are capable of transporting holes, i.e. positive charges, which are generally injected from the anode or an adjoining layer, for example a hole injection layer. A hole transport material generally has a high HOMO level of preferably at least −5.4 eV. According to the construction of an electronic device, it is also possible to use a hole transport material as hole injection material.

The preferred compounds having hole injection and/or hole transport properties include, for example, triarylamine, benzidine, tetraaryl-para-phenylenediamine, triarylphosphine, phenothiazine, phenoxazine, dihydrophenazine, thianthrene, dibenzo-para-dioxin, phenoxathiine, carbazole, azulene, thiophene, pyrrole and furan derivatives and further O-, S- or N-containing heterocycles with a high-lying HOMO (HOMO=highest occupied molecular orbital).

Particular mention should be made of the following compounds having hole injection and/or hole transport properties: phenylenediamine derivatives (U.S. Pat. No. 3,615, 404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717,462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conductive macromolecules, porphyrin compounds (JP-A-63-2956965, U.S. Pat. No. 4,720,432), aromatic dimethylidene-type compounds, carbazole compounds, for example CDBP, CBP, mCP, aromatic tertiary amine and styrylamine compounds (U.S. Pat. No. 4,127,412), for example triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines having one or more vinyl radicals and/or at least one functional group having active hydrogen (U.S. Pat. Nos. 3,567,450 and 3,658,520) or tetraaryldiamines (the two tertiary amine units are joined via an aryl group). It is also possible for even more triarylamino groups to be present in the molecule. Also suitable are phthalocyanine derivatives, naphthalocyanine derivatives, butadiene derivatives and quinoline derivatives, for example dipyrazino[2,3-f:2',3'-h]quinoxalinehexacarbonitrile.

Preference is given to aromatic tertiary amines having at least two tertiary amine units (US 2008/0102311 A1, U.S. Pat. Nos. 4,720,432 and 5,061,569), for example NPD (α-NPD=4,4'-bis[N-(1-naphthyl)-N-phenylamino]biphenyl) (U.S. Pat. No. 5,061,569), TPD 232 (=N,N'-bis(N,N'-diphenyl-4-aminophenyl)-N,N-diphenyl-4,4'-diamino-1,1'-biphenyl) or MTDATA (MTDATA or m-MTDATA=4,4',4"-tris[3-(methylphenyl)phenylamino]triphenylamine (JP-A-4-308688), TBDB (=N,N,N',N'-tetra(4-biphenyl)diaminobiphenylene), TAPC (=1,1-bis(4-di-p-tolylaminophenyl)cyclohexane), TAPPP (=1,1-bis(4-di-p-tolylaminophenyl)-3-phenylpropane), BDTAPVB (=1,4-bis[2-[4-[N,N-di(p-tolyl)amino]phenyl]vinyl]benzene), TTB (=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'''-diamino-1,1',4',1'',4'',1'''-quaterphenyl, and likewise tertiary amines having carbazole units, for example TCTA (=4-(9H-carbazol-9-yl)-N,N-bis[4-(9H-carbazol-9-yl)phenyl]benzeneamine). Likewise preferred are hexaazatriphenylene compounds according to US 2007/0092755 A1 and phthalocyanine derivatives (e.g. $H_2PC$, CuPc (=copper phthalocyanine), CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O-GaPc).

Particular preference is given to the following triarylamine compounds of the formulae (TA-1) to (TA-12), which are disclosed in documents EP 1162193 B1, EP 650 955 B1, Synth. Metals 1997, 91(1-3), 209, DE 19646119 A1, WO 2006/122630 A1, EP 1 860 097 A1, EP 1834945 A1, JP 08053397 A, U.S. Pat. No. 6,251,531 B1, US 2005/0221124, JP 08292586 A, U.S. Pat. No. 7,399,537 B2, US 2006/0061265 A1, EP 1 661 888 and WO 2009/041635. Said compounds of the formulae (TA-1) to (TA-12) may also be substituted:

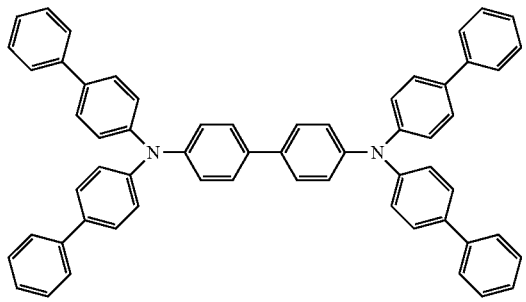

Formula TA-1

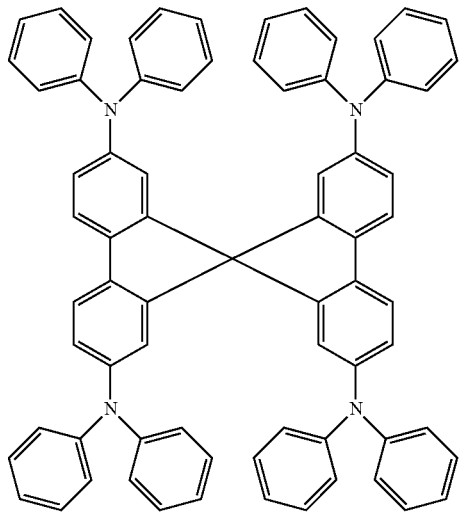

Formula TA-2

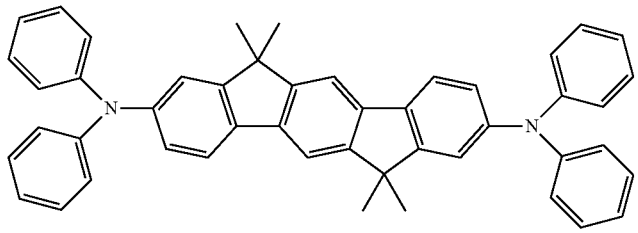

Formula TA-3

Formula TA-4
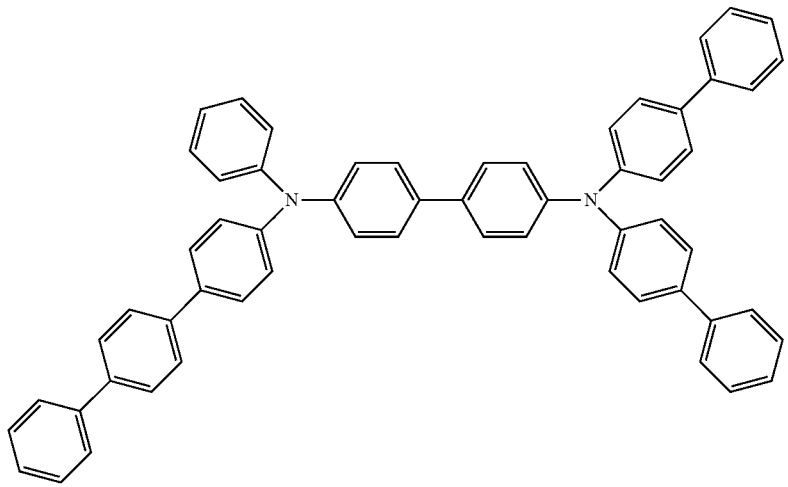
Formula TA-5
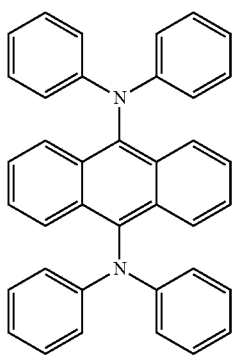
Formula TA-6
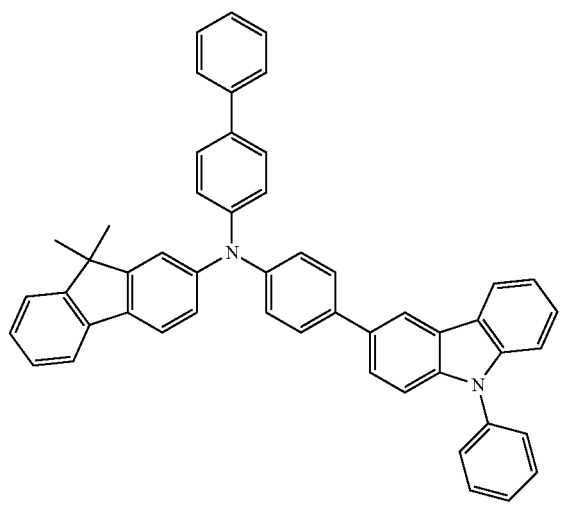
Formula TA-7
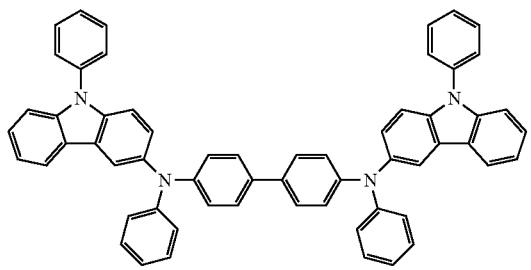
Formula TA-8
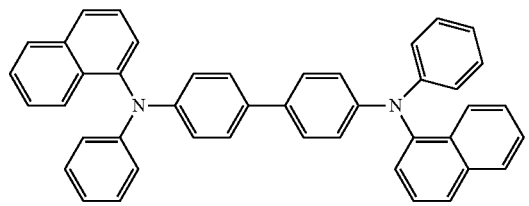
NPB = alpha-NPD Formula TA-9
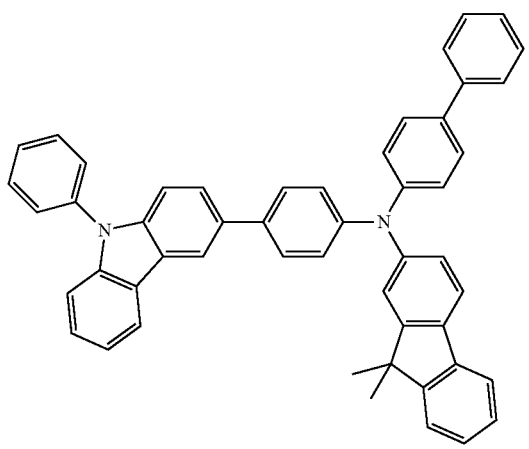
Formula TA-10
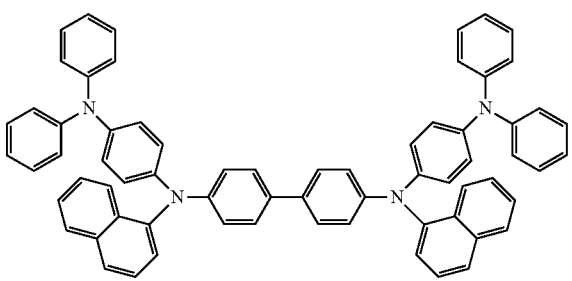
Formula TA-11
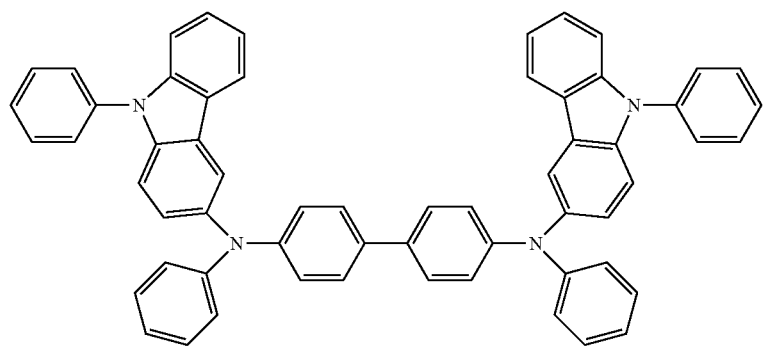
Formula TA-12
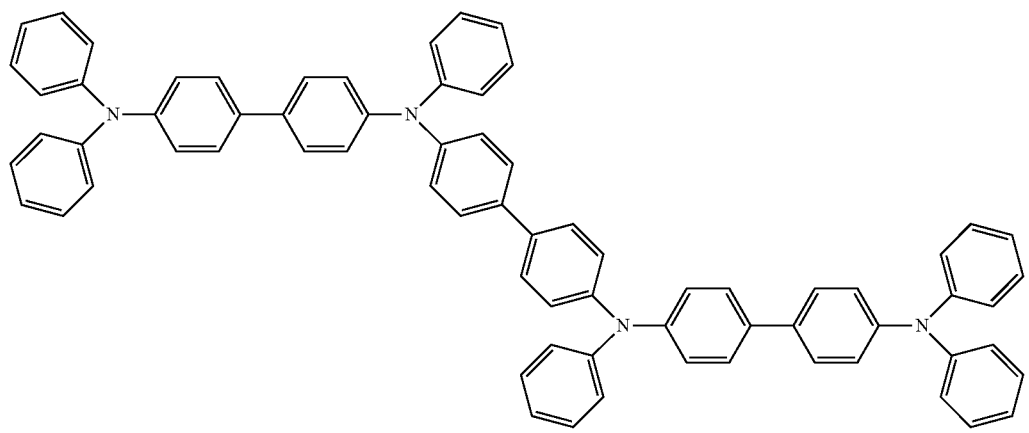

Further compounds which can be used as hole injection materials are described in EP 0891121 A1 and EP 1029909 A1, and injection layers in general terms in US 2004/0174116 A1.

Preferably, these arylamines and heterocycles, which are generally used as hole injection or hole transport materials, lead to a HOMO of more than −5.8 eV (versus vacuum level), more preferably of more than −5.5 eV.

Compounds having electron injection and/or electron transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles with a low-lying LUMO (LUMO=lowest unoccupied molecular orbital).

Particularly suitable compounds for electron-transporting and electron-injecting layers are metal chelates of 8-hydroxyquinoline (e.g. LiQ, AlQ$_3$, GaQ$_3$, MgQ$_2$, ZnQ$_2$, InQ$_3$, ZrQ$_4$), BAlQ, Ga oxinoid complexes, 4-azaphenanthren-5-ol Be complexes (U.S. Pat. No. 5,529,853 A, cf. Formula ET-1), butadiene derivatives (U.S. Pat. No. 4,356,429), heterocyclic optical brighteners (U.S. Pat. No. 4,539,507), benzimidazole derivatives (US 2007/0273272 A1), for example TPBI (U.S. Pat. No. 5,766,779, cf. formula ET-2), 1,3,5-triazines, e.g. spirobifluorene-triazine derivatives (for example according to DE 102008064200), pyrenes, anthracenes, tetracenes, fluorenes, spirofluorenes, dendrimers, tetracenes (e.g. rubrene derivatives), 1,10-phenanthroline derivatives (JP 2003-115387, JP 2004-311184, JP-2001-267080, WO 02/043449), silacyclopentadiene derivatives (EP 1480280, EP 1478032, EP 1469533), borane derivatives, for example triarylborane derivatives with Si (US 2007/0087219 A1, cf. formula ET-3), pyridine derivatives (JP 2004-200162), phenanthrolines, in particular 1,10-phenanthroline derivatives, for example BCP and Bphen, including multiple phenanthrolines joined via biphenyl or other aromatic groups (US-2007-0252517 A1) or phenanthrolines joined by anthracene (US 2007-0122656 A1, cf. formulae ET-4 and ET-5).

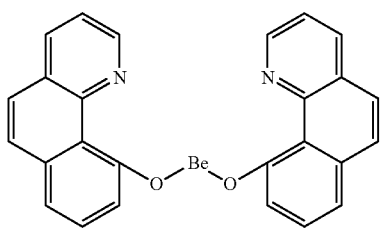

Formula ET-1

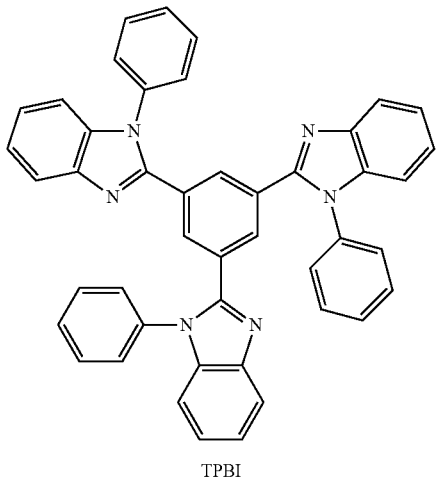

TPBI
2,2',2''-(1,3,5-benzenetriyl)tris(1-phenyl-1H-benzimidazole)

Formula ET-2

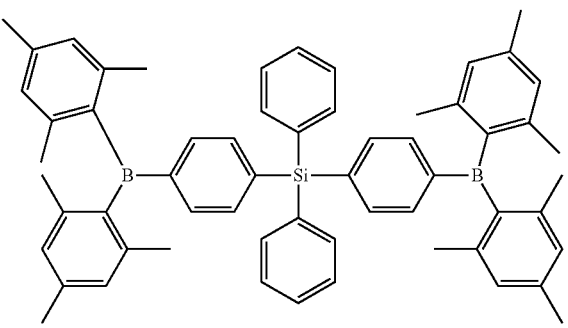

Formula ET-3

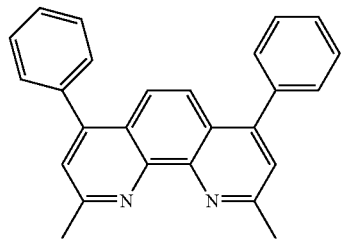

Formula ET-4

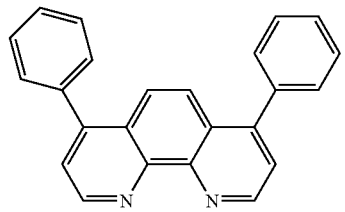

Formula ET-5

Likewise suitable are heterocyclic organic compounds, for example thiopyran dioxides, oxazoles, triazoles, imidazoles or oxadiazoles. Examples of the use of five-membered rings including N, for example oxazoles, preferably 1,3,4-oxadiazoles, for example compounds of formulae ET-6, ET-7, ET-8 and ET-9, which are disclosed inter alia in US 2007/0273272 A1; thiazoles, oxadiazoles, thiadiazoles, triazoles, inter alia, see US 2008/0102311 A1 and Y. A. Levin, M. S. Skorobogatova, Khimiya Geterotsiklicheskikh Soedinenii 1967 (2), 339-341, preferably compounds of the formula ET-10, silacyclopentadiene derivatives. Preferred compounds are the following of the formulae (ET-6) to (ET-10):

Formula ET-6

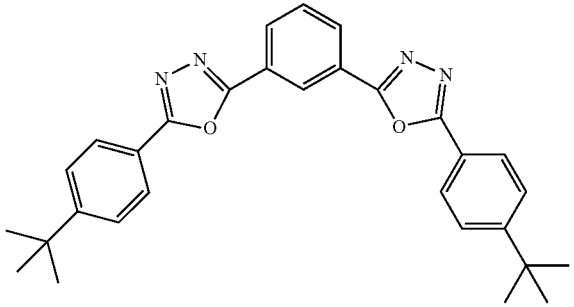

Formula ET-7

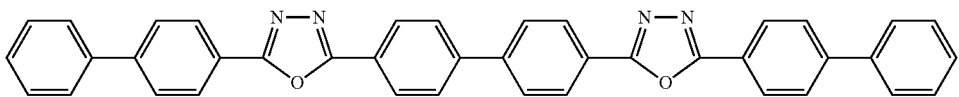

Formula ET-8

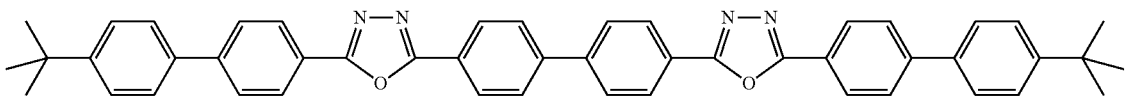

Formula ET-9

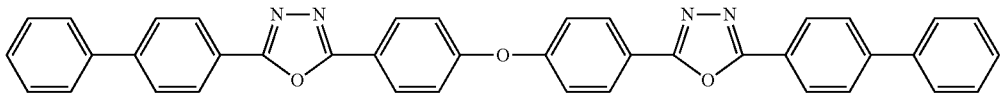

Formula ET-10

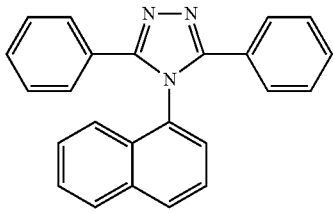

It is also possible to use organic compounds such as derivatives of fluorenone, fluorenylidenemethane, perylenetetracarboxylic acid, anthraquinonedimethane, diphenoquinone, anthrone and anthraquinonediethylenediamine.

Preference is given to 2,9,10-substituted anthracenes (by 1- or 2-naphthyl and 4- or 3-biphenyl) or molecules containing two anthracene units (US2008/0193796 A1, cf. formula ET-11). Also very advantageous is the use of 9,10-substituted anthracene units with benzimidazole derivatives (US 2006 147747 A and EP 1551206 A1, cf. formulae ET-12 and ET-13).

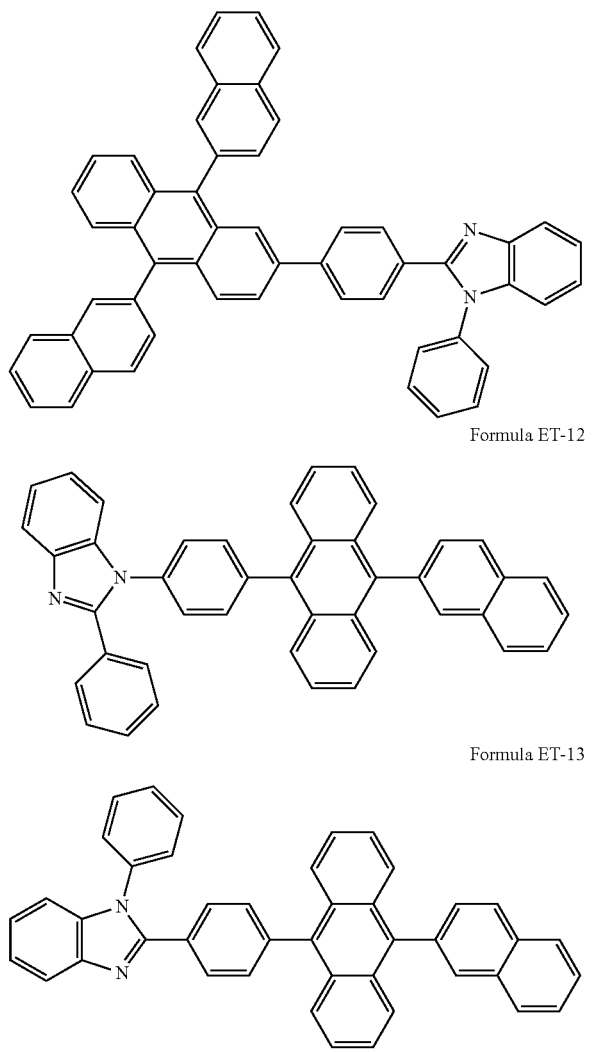

Formula ET-11

Formula ET-12

Formula ET-13

Preferably, the compounds that can generate the electron injection and/or electron transport properties lead to a LUMO of less than −2.5 eV (versus vacuum level), more preferably of less than −2.7 eV.

The present formulations may comprise emitters. The term "emitter" refers to a material which, after excitation, which can be effected by transfer of any kind of energy, allows a radiative transition with emission of light to a ground state. In general, there are two known classes of emitters, namely fluorescent and phosphorescent emitters. The term "fluorescent emitter" refers to materials or compounds where there is a radiative transition from an excited singlet state to the ground state. The term "phosphorescent emitter" refers preferably to luminescent materials or compounds comprising transition metals.

Emitters are frequently also referred to as dopants if the dopants cause the properties detailed above in a system. A dopant in a system comprising a matrix material and a dopant is understood to mean that component having the smaller proportion in the mixture. Correspondingly, a matrix material in a system comprising a matrix material and a dopant is understood to mean that component having the greater proportion in the mixture. The term "phosphorescent emitter" can accordingly, for example, also be understood to mean phosphorescent dopants.

Compounds which can emit light include fluorescent emitters and phosphorescent emitters. These include compounds having stilbene, stilbenamine, styrylamine, coumarin, rubrene, rhodamine, thiazole, thiadiazole, cyanine, thiophene, paraphenylene, perylene, phthalocyanine, porphyrin, ketone, quinoline, imine, anthracene and/or pyrene structures. Particular preference is given to compounds which can emit light with high efficiency from the triplet state even at room temperature, i.e. exhibit electrophosphorescence rather than electrofluorescence, which frequently brings about an increase in energy efficiency. Suitable for this purpose, first of all, are compounds containing heavy atoms having an atomic number of more than 36. Preferred compounds are those which contain d or f transition metals, which fulfil the abovementioned condition. Particular preference is given here to corresponding compounds containing elements of groups 8 to 10 (Ru, Os, Rh, Ir, Pd, Pt). Useful functional compounds here include, for example, various complexes as described, for example, in WO 02/068435 A1, WO 02/081488 A1, EP 1239526 A2 and WO 2004/026886 A2.

Detailed hereinafter by way of example are preferred compounds which can serve as fluorescent emitters. Preferred fluorescent emitters are selected from the class of the monostyrylamines, the distyrylamines, the tristyrylamines, the tetrastyrylamines, the styrylphosphines, the styryl ethers and the arylamines.

A monostyrylamine is understood to mean a compound containing one substituted or unsubstituted styryl group and at least one preferably aromatic amine. A distyrylamine is understood to mean a compound containing two substituted or unsubstituted styryl groups and at least one preferably aromatic amine. A tristyrylamine is understood to mean a compound containing three substituted or unsubstituted styryl groups and at least one preferably aromatic amine. A tetrastyrylamine is understood to mean a compound containing four substituted or unsubstituted styryl groups and at least one preferably aromatic amine. The styryl groups are more preferably stilbenes which may also have still further substitution. Corresponding phosphines and ethers are defined in analogy to the amines. An arylamine or an aromatic amine in the context of the present invention is understood to mean a compound containing three substituted or unsubstituted aromatic or heteroaromatic ring systems bonded directly to the nitrogen. Preferably, at least one of these aromatic or heteroaromatic ring systems is a fused ring system, preferably having 14 aromatic ring atoms. Preferred examples of these are aromatic anthracenamines, aromatic anthracenediamines, aromatic pyrenamines, aromatic pyrenediamines, aromatic chrysenamines or aromatic chrysenediamines. An aromatic anthracenamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 2,6 or 9,10 positions. Aromatic pyrenamines, pyrenediamines, chrysenamines and chrysenediamines are defined analogously thereto, where the diarylamino groups in the pyrene are bonded preferably in the 1 position or in the 1,6 positions.

Further preferred fluorescent emitters are selected from indenofluorenamines or -fluorenediamines detailed inter alia in WO 2006/122630; benzoindenofluorenamines or -fluorenediamines detailed inter alia in WO 2008/006449; and dibenzoindenofluorenamines or -fluorenediamines detailed inter alia in WO 2007/140847.

Examples of compounds which can be used as fluorescent emitters from the class of the styrylamines are substituted or unsubstituted tristilbenamines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines are to be found in US 2007/0122656 A1.

Particularly preferred styrylamine compounds are the compounds of the formula EM-1 described in U.S. Pat. No. 7,250,532 B2 and the compounds of the formula EM-2 described in DE 10 2005 058557 A1:

Formula EM-1

Formula EM-2

Particularly preferred triarylamine compounds are the compounds of the formulae EM-3 to EM-15 disclosed in CN 1583691 A, JP 08/053397 A and U.S. Pat. No. 6,251,531 B1, EP 1957606 A1, US 2008/0113101 A1, US 2006/210830 A, WO 2008/006449 and DE 102008035413 and the derivatives thereof:

Formula EM-3

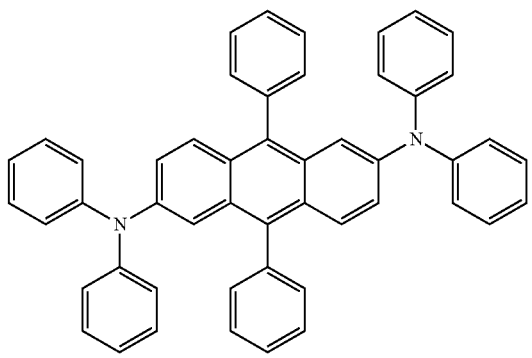

Formula EM-4

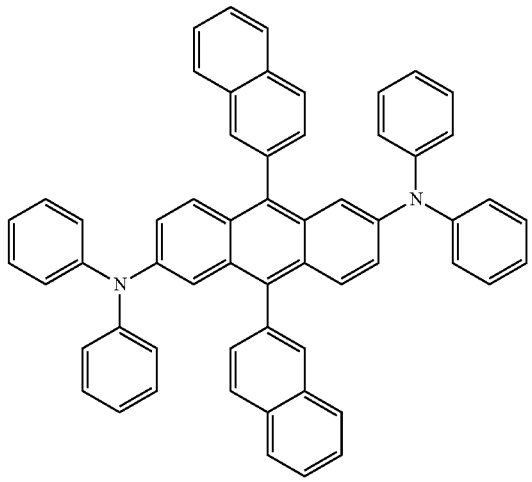

Formula EM-5

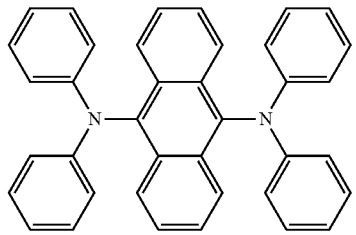

Formula EM-6

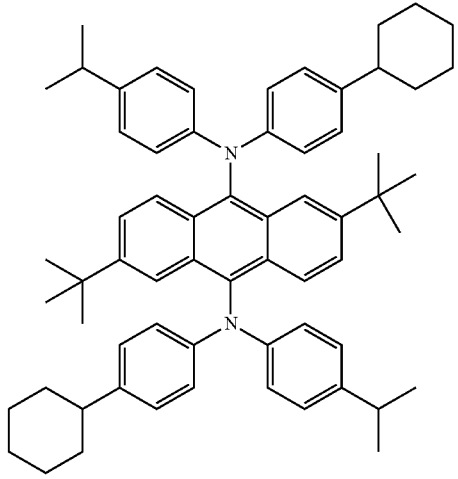

-continued

Formula EM-7

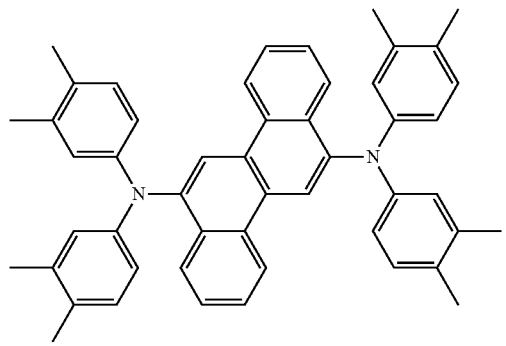

Formula EM-8

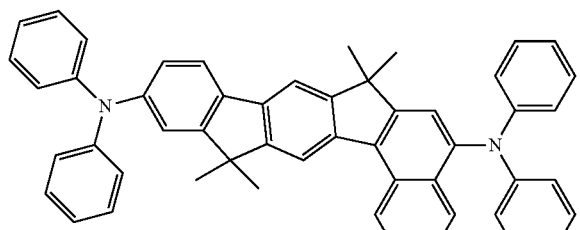

Formula EM-9

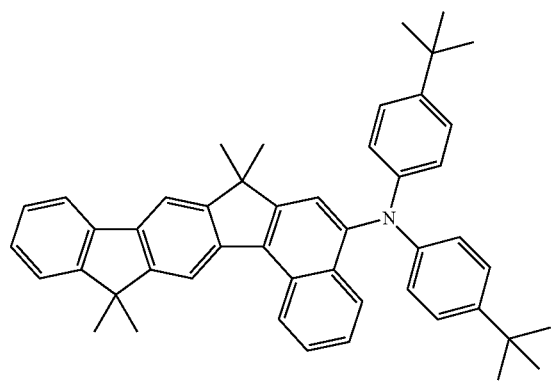

Formula EM-10

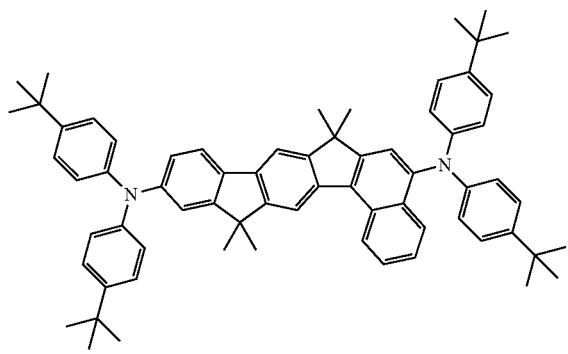

-continued

Formula EM-11

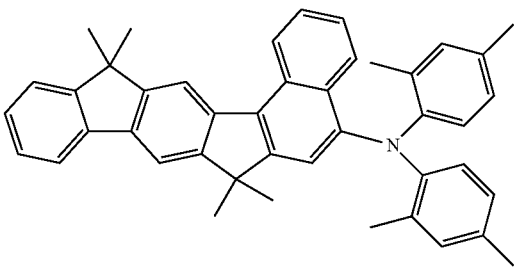

Formula EM-12

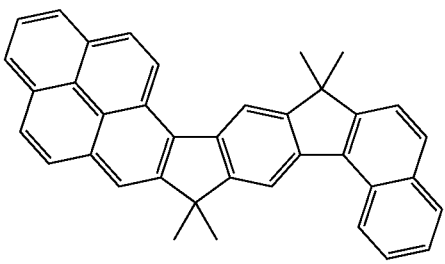

Formula EM-13

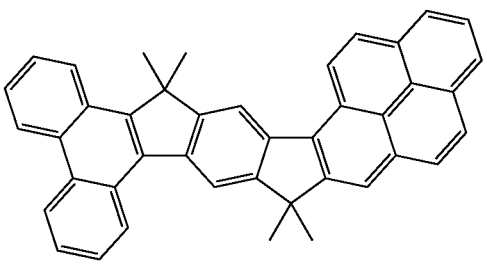

Formula EM-14

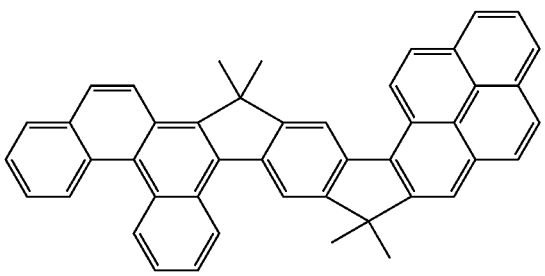

Formula EM-15

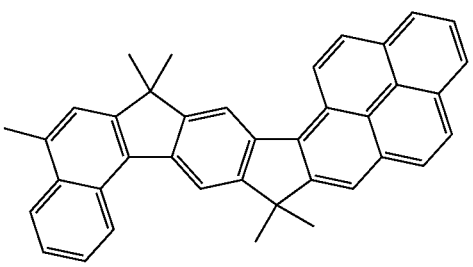

Further preferred compounds which can be used as fluorescent emitters are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacycline, coronene, tetraphenylcydopentadiene, pentaphenylcydopentadiene, fluorene, spirofluorene, rubrene, coumarin (U.S. Pat. Nos. 4,769,292, 6,020,078, US 2007/0252517 A1), pyran, oxazole, benzoxazole, benzothiazole, benzimidazole, pyrazine, cinnamic esters, diketopyrrolopyrrole, acridone and quinacridone (US 2007/0252517 A1).

Among the anthracene compounds, particular preference is given to anthracenes substituted in the 9,10 positions, for example 9,10-diphenylanthracene and 9,10-bis(phenylethynyl)anthracene. 1,4-Bis(9'-ethynylanthracenyl)benzene is also a preferred dopant.

Likewise preferred are derivatives of rubrene, coumarin, rhodamine, quinacridone, for example DMQA (=N,N'-dimethylquinacridone), dicyanomethylenepyran, for example DCM (=4-(dicyanoethylene)-6-(4-dimethylamino-styryl-2-methyl)-4H-pyran), thiopyran, polymethine, pyrylium and thiapyrylium salts, periflanthene and indenoperylene.

Blue fluorescent emitters are preferably polyaromatics, for example 9,10-di(2-naphthylanthracene) and other anthracene derivatives, derivatives of tetracene, xanthene, perylene, for example 2,5,8,11-tetra-t-butyl-perylene, phenylene, e.g. 4,4'-(bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130, 603), bis(azinyl)imineboron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Further preferred blue-fluorescing emitters are the hydrocarbons disclosed in DE 102008035413.

Detailed hereinafter by way of example are preferred compounds which can serve as phosphorescent emitters.

Examples of phosphorescent emitters can be found in WO 00/70655, WO 01/41512, WO 02/02714, WO 02/15645, EP 1191613, EP 1191612, EP 1191614 and WO 2005/033244. In general, all phosphorescent complexes as used for phosphorescent OLEDs according to the prior art and as known to those skilled in the art in the field of organic electroluminescence are suitable, and the person skilled in the art will be able to use further phosphorescent complexes without exercising inventive skill.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example for blue by fluorine, cyano and/or trifluoromethyl substituents. Auxiliary ligands are preferably acetylacetonate or picolinic acid.

Especially suitable as emitters are complexes of Pt or Pd with tetradentate ligands of formula EM-16.

Formula EM-16

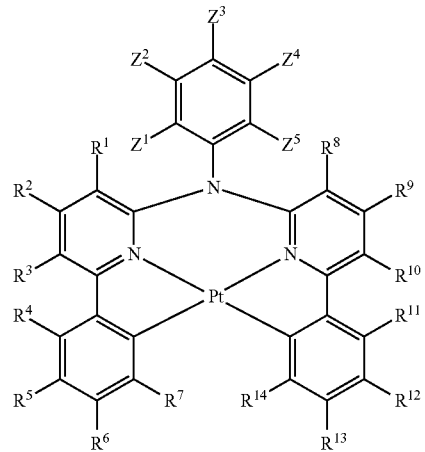

The compounds of the formula EM-16 are described in more detail in US 2007/0087219 A1, reference being made to this document for the purposes of disclosure for elucidation of the substituents and indices in the above formula. Additionally suitable are Pt-porphyrin complexes having an enlarged ring system (US 2009/0061681 A1) and Ir complexes, for example 2,3,7,8,12,13,17,18-octaethyl-21H, 23H-porphyrin-Pt(II), tetraphenyl-Pt(II)-tetrabenzoporphyrin (US 2009/0061681 A1), cis-bis(2-phenylpyndinato-N, $C^{2'}$)Pt(II), cis-bis(2-(2'-thienyl)pyridinato-N,$C^{3'}$)Pt(II), cis-bis(2-(2'-thienyl)quinolinato-N,$C^{5'}$)Pt(II), (2-(4,6-difluorophenyl)pyridinato-N,$C^{2'}$)Pt(II) acetylacetonate or tris(2-phenylpyridinato-N,$C^{2'}$)Ir(III) (Ir(ppy)$_3$, green), bis(2-phenylpyridinato-N,$C^2$)Ir(III) acetylacetonate (Ir(ppy)$_2$ acetylacetonate, green, US 2001/0053462 A1, Baldo, Thompson et al. *Nature* 403, (2000), 750-753), bis(1-phenylisoquinolinato-N,$C^{2'}$)(2-phenylpyridinato-N,$C^{2'}$)iridium (III), bis(2-phenylpyridinato-N,$C^{2'}$)(1-phenylisoquinolinato-N,$C^{2'}$)iridium(III), bis(2-(2'-benzothienyl)pyridinato-N,$C^{3'}$)iridium(III) acetylacetonate, bis(2-(4',6'-difluorophenyl)pyridinato-N,$C^{2'}$)iridium(III) picolinate (Firpic, blue), bis(2-(4',6'-difluorophenyl)pyridinato-N,$C^{2'}$) Ir(III) tetrakis(1-pyrazolyl)borate, tris(2-(biphenyl-3-yl)-4-tert-butylpyridine)iridium(III), (ppz)$_2$Ir(5phdpym) (US 2009/0061681 A1), (45ooppz)$_2$Ir(5phdpym) (US 2009/0061681 A1), derivatives of 2-phenylpyridine-Ir complexes, for example iridium(II) bis(2-phenylquinolyl-N,$C^{2'}$) acetylacetonate (PQIr), tris(2-phenylisoquinolinato-N,C)Ir(III) (red), bis(2-(2'-benzo[4,5-a]thienyl)pyridinato-N,$C^3$)Ir acetylacetonate ([Btp$_2$Ir(acac)], red, Adachi et al. *Appl. Phys. Lett.* 78 (2001), 1622-1624).

Likewise suitable are complexes of trivalent lanthanides, for example Tb$^{3+}$ and Eu$^{3+}$ (J. Kido et al. *Appl. Phys. Lett.* 65 (1994), 2124, Kido et al. Chem. Lett. 657, 1990, US 2007/0252517 A1) or phosphorescent complexes of Pt(II), Ir(I), Rh(I) with maleonitrile dithiolate (Johnson et al., *JACS* 105, 1983, 1795), Re(I)-tricarbonyldiimine complexes (inter alia Wrighton, *JACS* 96, 1974, 998), Os(II) complexes with cyano ligands and bipyridyl or phenanthroline ligands (Ma et al., *Synth. Metals* 94, 1998, 245).

Further phosphorescent emitters having tridentate ligands are described in U.S. Pat. No. 6,824,895 and U.S. Ser. No. 10/729,238. Red-emitting phosphorescent complexes are disclosed in U.S. Pat. Nos. 6,835,469 and 6,830,828.

Particularly preferred compounds which can be used as phosphorescent dopants include the compounds of the formula EM-17 described in US 2001/0053462 A1 and *Inorg. Chem.* 2001, 40(7), 1704-1711, JACS 2001, 123(18), 4304-4312 and derivatives thereof.

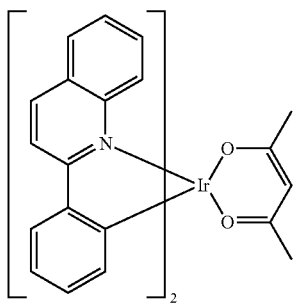

Formula EM-17

Derivatives are described in U.S. Pat. Nos. 7,378,162 B2, 6,835,469 B2 and JP 2003/253145 A.

In addition, it is possible to use the compounds of the formulae EM-18 to EM-21 described in U.S. Pat. No. 7,238,437 B2, US 2009/008607 A1 and EP 1348711 and derivatives thereof as emitters.

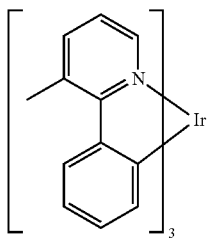

Formula EM-18

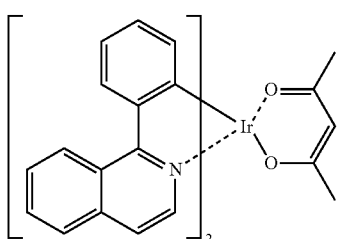

Formula EM-19

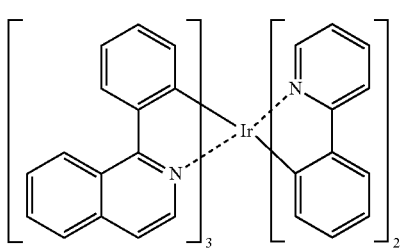

Formula EM-20

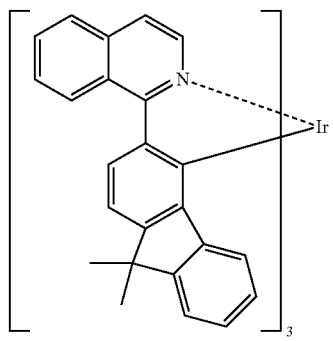

Formula EM-21

Quantum dots can likewise be used as emitters, these materials being disclosed in detail in WO 2011/076314 A1.

Compounds which are used as host materials, especially together with emitting compounds, include materials of various classes.

Host materials generally have greater band gaps between the HOMO and LUMO than the emitter materials used. In addition, preferred host materials exhibit properties either of a hole or electron transport material. Moreover, host materials may have either electron or hole transport properties.

Host materials are in some cases also referred to as matrix material, especially if the host material is used in combination with a phosphorescent emitter in an OLED.

Preferred host materials or co-host materials which are especially used together with fluorescent dopants are selected from the classes of the oligoarylenes (e.g. 2,2',7,7'-tetraphenylspirobifluorene according to EP 676461 or dinaphthylanthracene), especially of the oligoarylenes containing fused aromatic groups, for example anthracene, benzanthracene, benzophenanthrene (DE 10 2009 005746, WO 2009/069566), phenanthrene, tetracene, coronene, chrysene, fluorene, spirobifluorene, perylene, phthaloperylene, naphthaloperylene, decacyclene, rubrene, the oligoarylenevinylenes (e.g. DPVBi=4,4'-bis(2,2-diphenylethenyl)-1,1'-biphenyl or spiro-DPVBi according to EP 676461), the polypodal metal complexes (for example according to WO 2004/081017), especially metal complexes of 8-hydroxyquinoline, e.g. AlQ$_3$ (=aluminum(III) tris(8-hydroxyquinoline)) or bis(2-methyl-8-quinolinolato)-4-(phenylphenolinolato)aluminum, including with imidazole chelate (US 2007/0092753 A1), and the quinoline-metal complexes, aminoquinoline metal complexes, benzoquinoline metal complexes, the hole-conducting compounds (for example according to WO 2004/058911), the electron-conducting compounds, especially ketones, phosphine oxides, sulphoxides, etc. (for example according to WO 2005/084081 and WO 2005/084082), the atropisomers (for example according to WO 2006/048268), the boronic acid derivatives (for example according to WO 2006/117052) or the benzanthracenes (for example according to WO 2008/145239).

Particularly preferred compounds which can serve as host materials or co-host materials are selected from the classes of the oligoarylenes containing anthracene, benzanthracene and/or pyrene or atropisomers of these compounds. An oligoarylene in the context of the present invention shall be understood to mean a compound in which at least three aryl or arylene groups are bonded to one another.

Preferred host materials are especially selected from compounds of the formula (H-1)

$$Ar^4—(Ar^5)_p—Ar^6 \quad (H\text{-}1)$$

where $Ar^4$, $Ar^5$, $Ar^6$ is the same or different at each instance and is an aryl or heteroaryl group having 5 to 30 aromatic ring atoms which may optionally be substituted, and p represents an integer in the range from 1 to 5; at the same time, the sum of the π electrons in $Ar^4$, $Ar^5$ and $Ar^6$ is at least 30 when p=1, and is at least 36 when p=2, and is at least 42 when p=3.

More preferably, in the compounds of the formula (H-1), the $Ar^5$ group is anthracene and the $Ar^4$ and $Ar^6$ groups are bonded in the 9 and 10 positions, where these groups may optionally be substituted. Most preferably, at least one of the $Ar^4$ and/or $Ar^6$ groups is a fused aryl group selected from 1- or 2-naphthyl, 2-, 3- or 9-phenanthrenyl or 2-, 3-, 4-, 5-, 6- or 7-benzanthracenyl. Anthracene-based compounds are described in US 2007/0092753 A1 and US 2007/0252517 A1, for example 2-(4-methylphenyl)-9,10-di(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds having two anthracene units (US 2008/0193796 A1), e.g. 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadiene, tetraphenylcyclopentadiene, pentaphenylcyclopentadiene, coumarin, oxadiazole, bisbenzoxazoline, oxazole, pyridine, pyrazine, imine, benzothiazole, benzoxazole, benzimidazole (US 2007/0092753 A1), e.g. 2,2',2"-(1,3,5-phenylene)tris[1-phenyl-1H-benzimidazole], aldazine, stilbene, styrylarylene derivatives, e.g. 9,10-bis[4-(2,2-diphenylethenyl)phenyl]anthracene and distyrylarylene derivatives (U.S. Pat. No. 5,121,029), diphenylethylene, vinylanthracene, diaminocarbazole, pyran, thiopyran, diketopyrrolopyrrole, polymethine, cinnamic esters and fluorescent dyes.

Particular preference is given to derivatives of arylamine and styrylamine, e.g. TNB (=4,4'-bis[N-(1-naphthyl)-N-(2-naphthyl)amino]biphenyl). Metal oxinoid complexes such as LiQ or $AlQ_3$ can be used as co-hosts.

Preferred compounds with oligoarylene as the matrix are disclosed in US 2003/0027016 A1, U.S. Pat. No. 7,326,371 B2, US 2006/043858 A, WO 2007/114358, WO 2008/145239, JP 3148176 B2, EP 1009044, US 2004/018383, WO 2005/061656 A1, EP 068101981, WO 2004/013073A1, U.S. Pat. No. 5,077,142, WO 2007/065678 and DE 102009005746, particularly preferred compounds being described by the formulae H-2 to H-8.

Formula H-2

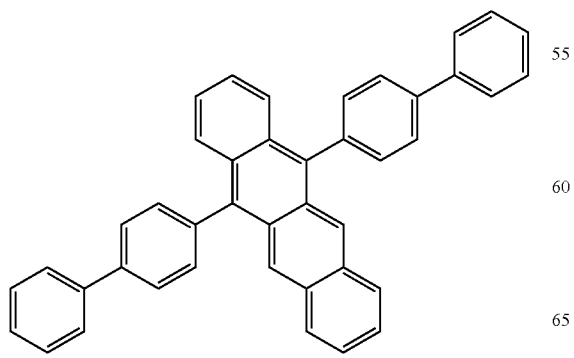

Formula H-3

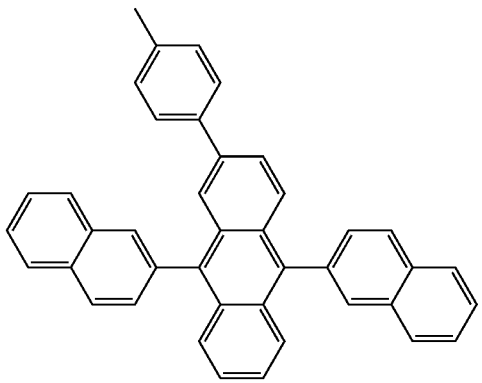

Formula H-4

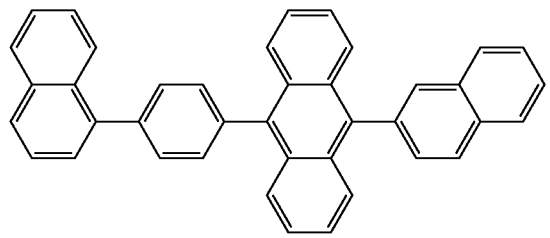

Formula H-5

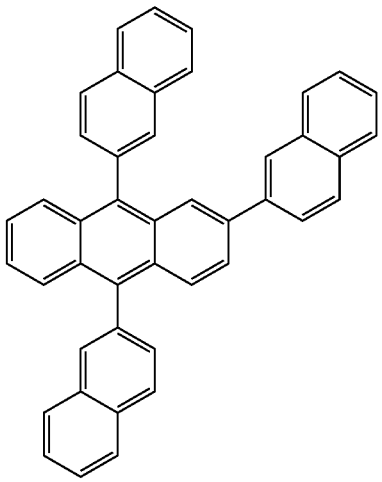

Formula H-6

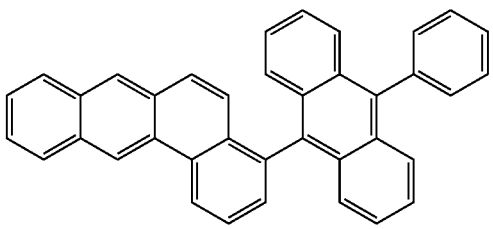

Formula H-7

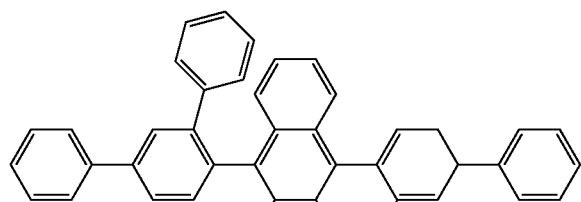

Formula H-8

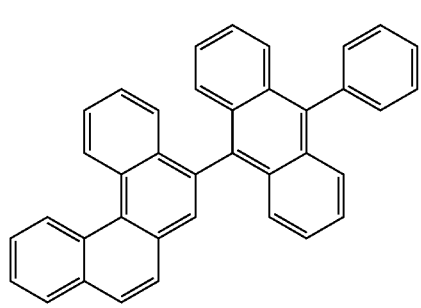

In addition, compounds which can be used as host or matrix include materials which are used together with phosphorescent emitters. These compounds, which can also be used as structural elements in polymers, include CBP (N,N-biscarbazolylbiphenyl), carbazole derivatives (for example according to WO 2005/039246, US 2005/0069729, JP 2004/288381, EP 1205527 or WO 2008/086851), azacarbazoles (for example according to EP 1617710, EP 1617711, EP 1731584 or JP 2005/347160), ketones (for example according to WO 2004/093207 or according to DE 102008033943), phosphine oxides, sulphoxides and sulphones (for example according to WO 2005/003253), oligophenylenes, aromatic amines (for example according to US 2005/0069729), bipolar matrix materials (for example according to WO 2007/137725), silanes (for example according to WO 2005/111172), 9,9-diarylfluorene derivatives (for example according to DE 102008017591), azaboroles or boronic esters (for example according to WO 2006/117052), triazine derivatives (for example according to DE 102008036982), indolocarbazole derivatives (for example according to WO 2007/063754 or WO 2008/056746), indenocarbazole derivatives (for example according to DE 102009023155 and DE 102009031021), diazaphosphole derivatives (for example according to DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, for example AlQ$_3$ (the 8-hydroxyquinoline complexes may also contain triarylaminophenol ligands (US 2007/0134514 A1), metal complex polysilane compounds and thiophene, benzothiophene and dibenzothiophene derivatives.

Examples of preferred carbazole derivatives are mCP (=1,3-N,N-dicarbazolebenzene (=9,9'-(1,3-phenylene)bis-9H-carbazole)) (formula H-9), CDBP (=9,9'-(2,2'-dimethyl [1,1'-biphenyl]-4,4'-diyl)bis-9H-carbazole), 1,3-bis(N,N'-dicarbazole)benzene (=1,3-bis(carbazol-9-yl)benzene), PVK (polyvinylcarbazole), 3,5-di(9H-carbazol-9-yl)biphenyl and CMTTP (Formula H10). Particularly preferred compounds are disclosed in US 2007/0128467 A1 and US 2005/0249976 A1 (formulae H-11 to H-13).

Formula H-9

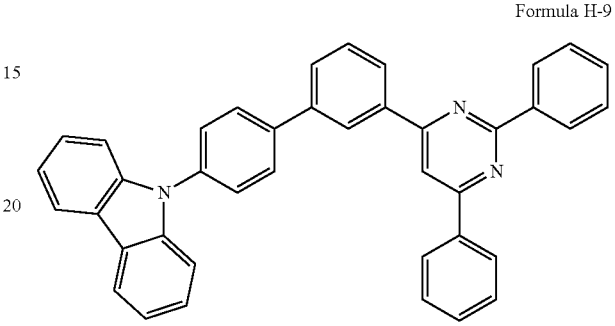

Formula H-10

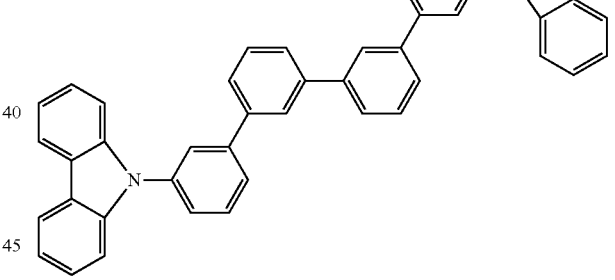

CMTTP

Formula H-11

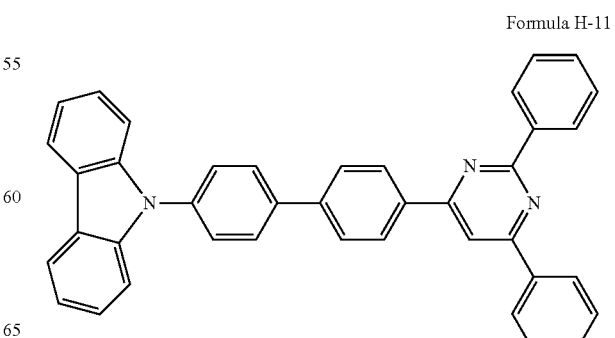

Formula H-12

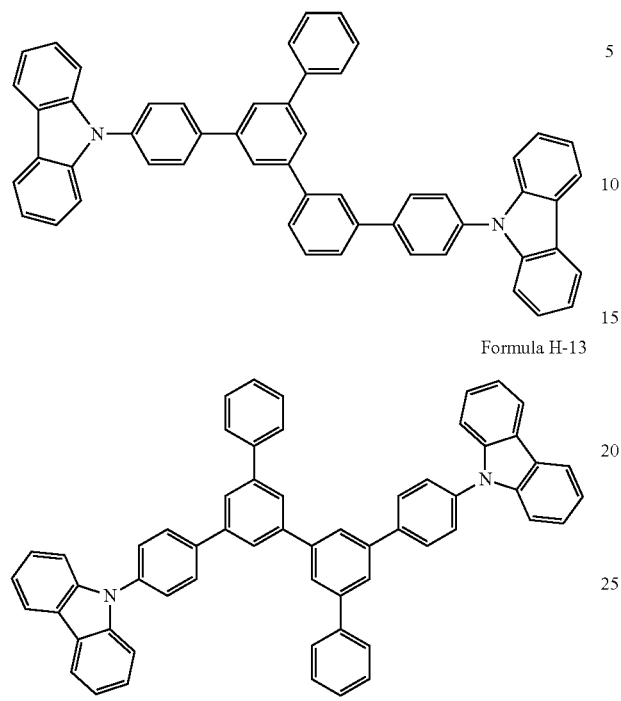

Formula H-13

Preferred Si-tetraaryls are disclosed, for example, in US 2004/0209115, US 2004/0209116, US 2007/0087219 A1 qnd in H. Gilman, E. A. Zuech, Chemistry & Industry (London, United Kingdom), 1960, 120.

Particularly preferred Si-tetraaryls are described by the formulae H-14 to H-21.

Formula H-14

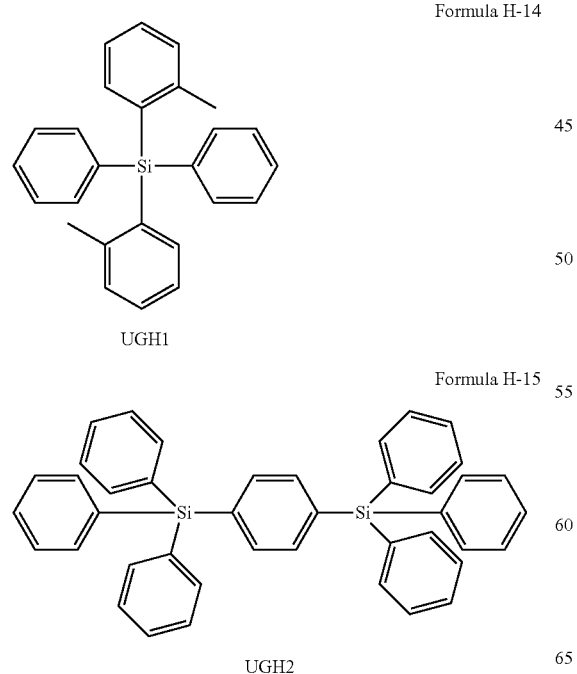

UGH1

Formula H-15

UGH2

Formula H-16

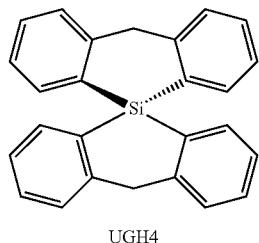

UGH4

Formula H-17

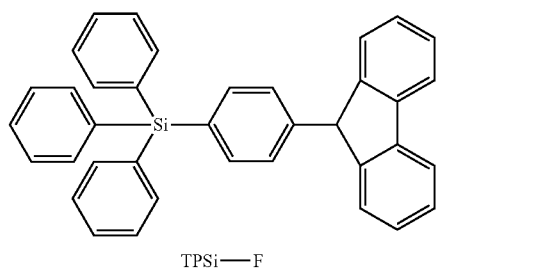

TPSi—F
Triphenyl-[4-(9-phenyl-9H-fluoren-9-yl)phenyl]silane

Formula H-18

SimCP

Formula H-19

Formula H-20

Formula H-21

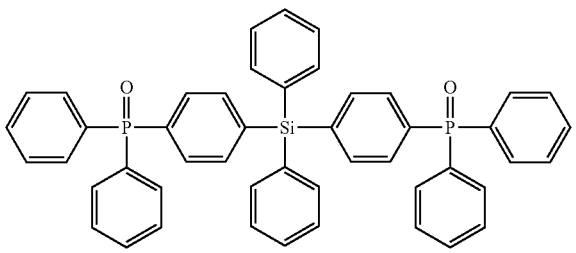

Particularly preferred compounds for production of a matrix for phosphorescent dopants are disclosed inter alia in DE 102009022858, DE 102009023155, EP 652273 B1, WO 2007/063754 and WO 2008/056746, particularly preferred compounds being described by the formulae H-22 to H-25.

Formula H-22

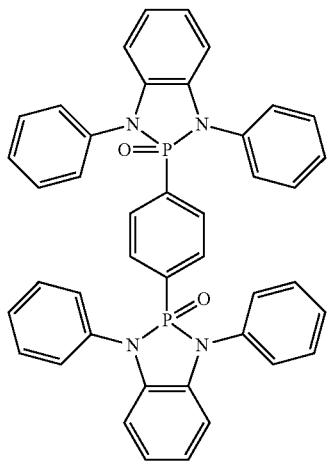

Formula H-23

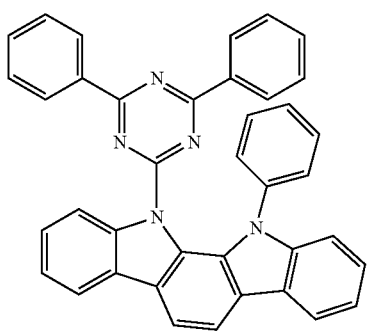

Formula H-24

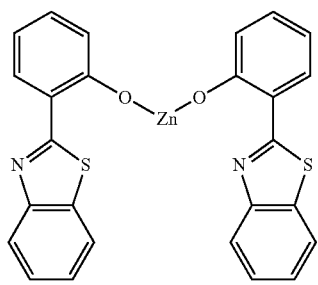

Formula H-25

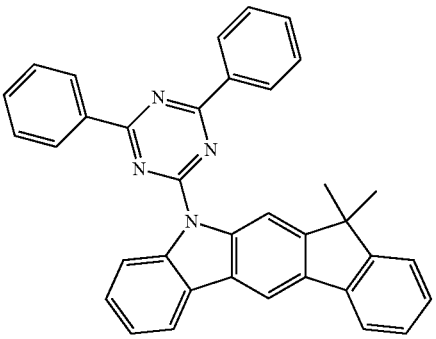

With regard to the organic semiconductors usable in accordance with the invention that can serve as host material, preference is given especially to substances having at least one nitrogen atom. These preferably include aromatic amines, triazine derivatives and carbazole derivatives. For instance, carbazole derivatives in particular exhibit a surprisingly high efficiency. Triazine derivatives lead to unexpectedly long lifetimes of the electronic devices.

It may also be preferable to use a plurality of different matrix materials as a mixture, especially at least one electron-conducting matrix material and at least one hole-conducting matrix material. Preference is likewise given to the use of a mixture of a charge-transporting matrix material and an electrically inert matrix material having no significant involvement, if any, in the charge transport, as described, for example, in WO 2010/108579.

In addition, it is possible to use compounds which improve the transition from the singlet to the triplet state and which, used in support of compounds having emitter properties, improve the phosphorescence properties of these compounds. Useful units for this purpose are especially carbazole and bridged carbazole dimer units, as described, for example, in WO 2004/070772 A2 and WO 2004/113468 A1. Additionally useful for this purpose are ketones, phosphine oxides, sulphoxides, sulphones, silane derivatives and similar compounds, as described, for example, in WO 2005/040302 A1.

n-Dopants are understood herein to mean reducing agents, i.e. electron donors. Preferred examples of n-dopants are W(hpp)4 and further electron-rich metal complexes according to WO 2005/086251 A2, P=N compounds (e.g. WO 2012/175535 A1, WO 2012/175219 A1), naphthylenecarbo-diimides (e.g. WO 2012/168358 A1), fluorenes (e.g. WO 2012/031735 A1), radicals and diradicals (e.g. EP 1837926 A1, WO 2007/107306 A1), pyridines (e.g. EP 2452946 A1, EP 2463927 A1), N-heterocyclic compounds (e.g. WO 2009/000237 A1) and acridines and phenazines (e.g. US 2007/145355 A1).

In addition, the formulations may contain a wide band gap material as functional material. A wide band gap material is understood to mean a material in the sense of the disclosure of U.S. Pat. No. 7,294,849. These systems exhibit particularly advantageous performance data in electroluminescent devices.

Preferably, the compound used as wide band gap material may have a band gap of 2.5 eV or more, preferably 3.0 eV or more, more preferably of 3.5 eV or more. One way of calculating the band gap is via the energy levels of the highest occupied molecular orbital (HOMO) and the lowest unoccupied molecular orbital (LUMO).

In addition, the formulations may comprise, as organic semiconductor, a hole blocker material (HBM). A hole blocker material refers to a material which prevents or minimizes the conduction of holes (positive charges) in a multilayer composite, especially if this material is arranged in the form of a layer adjacent to an emission layer or a hole-conducting layer. In general, a hole blocker material has a lower HOMO level than the hole transport material in the adjacent layer. Hole blocker layers are frequently arranged between the light-emitting layer and the electron transport layer in OLEDs.

In principle, it is possible to use any known hole blocker material. In addition to further hole blocker materials detailed elsewhere in the present application, appropriate hole blocker materials are metal complexes (US 2003/0068528), for example bis(2-methyl-8-quinolinolato)(4-phenylphenolato)aluminium(III) (BAlQ). Fac-tris(1-phenylpyrazolato-N,C2)iridium(III) (Ir(ppz)3) is likewise used for these purposes (US 2003/0175553 A1). Phenanthroline derivatives, for example BCP, or phthalimides, for example TMPP, may likewise be used.

In addition, appropriate hole blocker materials are described in WO 00/70655 A2, WO 01/41512 and WO 01/93642 A1.

In addition, the formulations may comprise, as organic semiconductor, an electron blocker material (EBM). An electron blocker material refers to a material which prevents or minimizes the conduction of electrons in a multilayer composite, especially if this material is arranged in the form of a layer adjacent to an emission layer or an electron-conducting layer. In general, an electron blocker material has a higher LUMO level than the electron transport material in the adjacent layer.

In principle, it is possible to use any known electron blocker material. In addition to further electron blocker materials described elsewhere in the present application, appropriate electron blocker materials are transition metal complexes, for example Ir(ppz)$_3$ (US 2003/0175553).

Preferably, the electron blocker material may be selected from amines, triarylamines and derivatives thereof.

In addition, the compounds which can be used in the formulations as organic semiconductor, provided that they are low molecular weight compounds, preferably have a molecular weight of ≤3000 g/mol, more preferably of ≤2000 g/mol and especially preferably of ≤1000 g/mol.

Additionally of particular interest are organic semiconductor materials which feature a high glass transition temperature. In this connection, preference is given to compounds which can be used in the formulations as organic semiconductor material and have a glass transition temperature of ≥70° C., preferably of ≥100° C., more preferably of ≥125° C. and especially preferably of ≥150° C., determined according to DIN 51005:2005-08.

The formulations may also contain polymers as organic semiconductor materials. The compounds described as organic semiconductor materials above, which in many cases have a relatively low molecular weight, can also be mixed with a polymer. It is likewise possible to incorporate these compounds covalently into a polymer. This is especially possible with compounds substituted by reactive leaving groups such as bromine, iodine, chlorine, boronic acid or boronic ester, or by reactive polymerizable groups such as olefins or oxetanes. These may find use as monomers for production of corresponding oligomers, dendrimers or polymers. The oligomerization or polymerization is preferably effected via the halogen functionality or the boronic acid functionality or via the polymerizable group. It is additionally possible to crosslink the polymers via groups of this kind. The compounds and polymers usable in accordance with the invention may be used in the form of a crosslinked or uncrosslinked layer.

Polymers which can be used as organic semiconductor materials in many cases include units or structural elements which have been described in the context of the compounds detailed above, including those as disclosed and listed extensively in WO 02/077060 A1, in WO 2005/014689 A2 and in WO 2011/076314 A1. These are considered to form part of the present application by reference. The functional materials may come, for example, from the following classes:

Group 1: structural elements which can produce hole injection and/or hole transport properties;

Group 2: structural elements which can produce electron injection and/or electron transport properties;

Group 3: structural elements which are a combination in relation to the properties detailed for groups 1 and 2;

Group 4: structural elements having light-emitting properties, especially phosphorescent groups;

Group 5: structural elements which improve the transition from what is called the singlet state to the triplet state;

Group 6: structural elements which affect the morphology or else the emission colour of the resulting polymers;

Group 7: structural elements which are typically used as the backbone.

The structural elements here may also have different functions, and so unambiguous assignment may not be appropriate. For example, a structural element of group 1 may likewise serve as backbone.

Preferably, the polymer having hole transport or hole injection properties which is used as organic semiconductor material, comprising structural elements of group 1, may have units corresponding to the hole transport or hole injection materials that have been detailed above.

Further preferred structural elements of group 1 are, for example, triarylamine derivatives, benzidine derivatives, tetraaryl-para-phenylenediamine derivatives, carbazole derivatives, azulene derivatives, thiophene derivatives, pyrrole derivatives and furan derivatives, and further O-, S- or N-containing heterocycles having a high-lying HOMO. These arylamines and heterocycles preferably have a HOMO of more than −5.8 eV (versus vacuum level), more preferably of more than −5.5 eV.

Preference is given inter alia to polymers having hole transport or hole injection properties comprising at least one of the following repeat units of formula HTP-1:

HTP-1 in which the symbols are defined as follows:

Ar$^1$ is the same or different in each case for different repeat units and is a single bond or a monocyclic or polycyclic aryl group which may optionally be substituted;

Ar$^2$ is the same or different in each case for different repeat units and is a monocyclic or polycyclic aryl group which may optionally be substituted;

Ar³ is the same or different in each case for different repeat units and is a monocyclic or polycyclic aryl group which may optionally be substituted;

m is 1, 2 or 3.

Particular preference is given to repeat units of the formula HTP-1 selected from the group consisting of units of the formulae HTP-1A to HTP-1C:

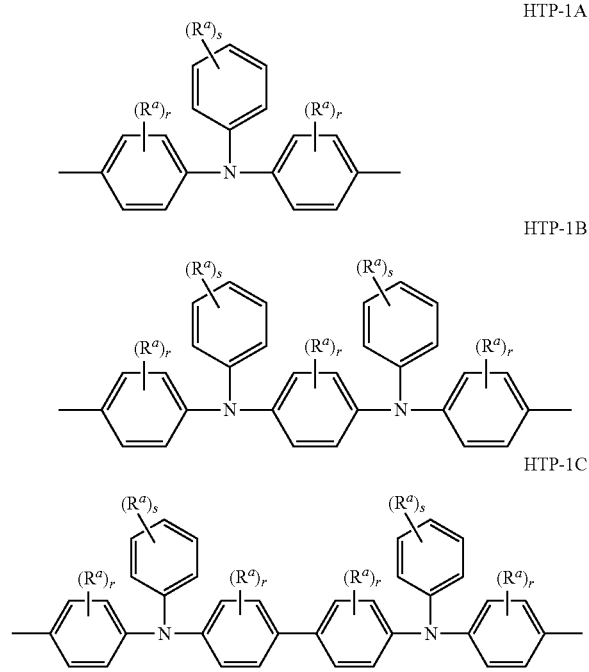

in which the symbols are defined as follows:

$R^a$ is the same or different at each instance and is H, a substituted or unsubstituted aromatic or heteroaromatic group, an alkyl, cycloalkyl, alkoxy, aralkyl, aryloxy, arylthio, alkoxycarbonyl, silyl or carboxyl group, a halogen atom, a cyano group, a nitro group or a hydroxyl group;

r is 0, 1, 2, 3 or 4 and s is 0, 1, 2, 3, 4 or 5.

Preference is given inter alia to polymers having hole transport or hole injection properties comprising at least one of the following repeat units of formula HTP-2:

in which the symbols are defined as follows:

$T^1$ and $T^2$ are independently selected from thiophene, selenophene, thieno[2,3b]thiophene, thieno[3,2b]thiophene, dithienothiophene, pyrrole, aniline, where these groups may be substituted by one or more $R^b$ radicals;

$R^b$ is the same or different at each instance and is selected from halogen, —CN, —NC, —NCO, —NCS, —OCN, SCN, C(=O)NR°R°°, —C(=O)X, —C(=O)R°, —NH₂, —NR°R°°, SH, SR°, —SO₃H, —SO₂R°, —OH, —NO₂, —CF₃, —SF₅, an optionally substituted silyl, carbyl or hydrocarbyl group having 1 to 40 carbon atoms which may optionally be substituted and may optionally comprise one or more heteroatoms;

$R°$ and $R°°$ are each independently H or an optionally substituted carbyl or hydrocarbyl group having 1 to 40 carbon atoms which may optionally be substituted and may optionally comprise one or more heteroatoms;

$Ar^7$ and $Ar^8$ are independently a monocyclic or polycyclic aryl or heteroaryl group which may optionally be substituted and may optionally be bonded to the 2,3 positions of one or both adjacent thiophene or selenophene groups;

c and e are independently 0, 1, 2, 3 or 4, where 1<c+e≤6, d and f are independently 0, 1, 2, 3 or 4.

Preferred examples of polymers having hole transport or hole injection properties are described inter alia in WO 2007/131582 A1 and WO 2008/009343 A1.

Preferably, the polymer having electron injection and/or electron transport properties which is used as organic semiconductor material, comprising structural elements of group 2, may have units corresponding to the electron injection and/or electron transport materials that have been detailed above.

Further preferred structural elements of group 2 that include electron injection and/or electron transport properties are derived, for example, from pyridine, pyrimidine, pyridazine, pyrazine, oxadiazole, quinoline, quinoxaline and phenazine groups, but also triarylborane groups or further O-, S- or N-containing heterocycles having a low-lying LUMO level. Preferably, these structural elements of group 2 have a LUMO of less than −2.7 eV (versus vacuum level), more preferably of less than −2.8 eV.

Preferably, the organic semiconductor material may be a polymer comprising structural elements of group 3, where structural elements which improve hole and electron mobility (i.e. structural elements of groups 1 and 2) are joined directly to one another. Some of these structural elements may serve here as emitters, in which case the emission colours can be shifted, for example, into the green, red or yellow. The use thereof is therefore appropriate, for example, for the production of other emission colours or broadband emission by polymers that originally emit in the blue.

It is possible with preference to use a polymer having light-emitting properties, comprising structural elements of group 4 corresponding to the emitter materials that have been detailed above. Preference is given here to polymers having phosphorescent groups, especially the emitting metal complexes detailed above, containing corresponding units having elements of groups 8 to 10 (Ru, Os, Rh, Ir, Pd, Pt).

Preferably, a polymer used having units of group 5 which improve the transition from what is called the singlet state to the triplet state can be used to support phosphorescent compounds, preferably the above-detailed polymers having structural elements of group 4. It is possible here to use a polymeric triplet matrix.

Especially suitable for this purpose are carbazole and bonded carbazole dimer units, as described, for example, in DE 10304819 A1 and DE 10328627 A1. Also suitable for this purpose are ketone, phosphine oxide, sulphoxide, sulphone and silane derivatives and similar compounds, as described, for example, in DE 10349033 A1. In addition, preferred structural units may be derived from compounds which have been described above in connection with the matrix materials which are used together with phosphorescent compounds.

Preference is given to using a polymer comprising units of group 6 which affect the morphology and/or the emission colour of the polymers. As well as the abovementioned polymers, these are those polymers which have at least one further aromatic or one other conjugated structure which is not among the abovementioned groups. These groups accordingly have only minor effects, if any, on the charge carrier mobilities which not organometallic complexes or the singlet-triplet transition.

Structural units of this kind can affect the morphology and/or the emission colour of the resulting polymers. According to the structural unit, these polymers can therefore also be used as emitters.

In the case of fluorescent OLEDs, suitable aromatic structural elements are therefore those having 6 to 40 carbon atoms or else tolane, stilbene or bisstyrylarylene derivative units, each of which may be substituted by one or more radicals. Particular preference is given to the use of groups derived from 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4''-terphenylylene, 4,4' bi-1,1'-naphthylylene, 4,4'-tolanylene, 4,4'-stilbenylene or 4,4''-bisstyrylarylene.

Preferably, a polymer comprises units of group 7 containing preferably aromatic structural units having 6 to 40 carbon atoms that are frequently used as backbone.

These include, inter alia, 4,5-dihydropyrene derivatives, 4,5,9,10-tetrahydropyrene derivatives, fluorene derivatives which are disclosed, for example, in U.S. Pat. No. 5,962,631, WO 2006/052457 A2 and WO 2006/118345 A1, 9,9-spirobifluorene derivatives which are disclosed, for example, in WO 2003/020790 A1, 9,10-phenanthrene derivatives which are disclosed, for example, in WO 2005/104264 A1, 9,10-dihydrophenanthrene derivatives which are disclosed, for example, in WO 2005/014689 A2, 5,7-dihydrodibenzooxepine derivatives and cis- and trans-indenofluorene derivatives which are disclosed, for example, in WO 2004/041901 A1 and WO 2004/113412 A2, and binaphthylene derivatives which are disclosed, for example, in WO 2006/063852 A1, and further units which are disclosed, for example, in WO 2005/056633 A1, EP 1344788 A1, WO 2007/043495 A1, WO 2005/033174 A1, WO 2003/099901 A1 and DE 102006003710.

Particular preference is given to structural units of group 7 which are selected from fluorene derivatives which are disclosed, for example, in U.S. Pat. No. 5,962,631, WO 2006/052457 A2 and WO 2006/118345 A1; spirobifluorene derivatives which are disclosed, for example, in WO 2003/020790 A1; benzofluorene, dibenzofluorene, benzothiophene, dibenzofluorene groups and derivatives thereof, which are disclosed, for example, in WO 2005/056633 A1, EP 1344788 A1 and WO 2007/043495 A1.

Especially preferred structural elements of group 7 are illustrated by the general formula PB-1:

Formula PB-1

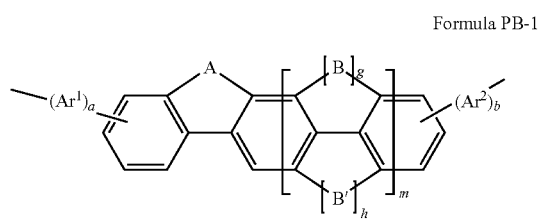

in which the symbols and indices have the following definitions:

A, B and B' are each, including for different repeat units, the same or different and are a divalent group preferably selected from —CR$^c$R$^d$—, —NR$^c$—, —PR$^c$—, —O—, —S—, —SO—, —SO$_2$—, —CO—, —CS—, —CSe—, —P(=O)R$^c$—, —P(=S)R$^c$— and —SiR$^c$R$^d$—;

R$^c$ and R$^d$ are the same or different at each instance and are selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, an optionally substituted silyl, carbyl or hydrocarbyl group having 1 to 40 carbon atoms which may optionally be substituted and may optionally comprise one or more heteroatoms, where the R$^c$ and R$^d$ groups can optionally form a spiro group with a fluorene radical to which they are bonded;

X is halogen;

R$^0$ and R$^{00}$ are each independently H or an optionally substituted carbyl or hydrocarbyl group having 1 to 40 carbon atoms which may optionally be substituted and may optionally comprise one or more heteroatoms;

g is in each case independently 0 or 1 and h is in each case independently 0 or 1, where the sum total of g and h in any subunit is preferably 1;

m is an integer ≥1;

Ar$^1$ and Ar$^2$ are independently a monocyclic or polycyclic aryl or heteroaryl group which may optionally be substituted and may optionally be bonded to the 7,8 positions or the 8,9 positions of an indenofluorene group;

a and b are independently 0 or 1.

If the R$^c$ and R$^d$ groups form a spiro group with the fluorene group to which these groups are bonded, this group is preferably a spirobifluorene.

Particular preference is given to repeat units of the formula PB-1 selected from the group consisting of units of the formulae PB-1A to PB-1E:

Formula PB-1A

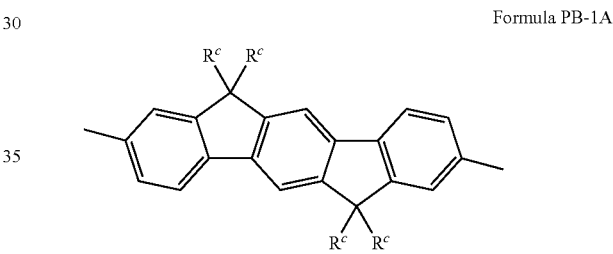

Formula PB-1B

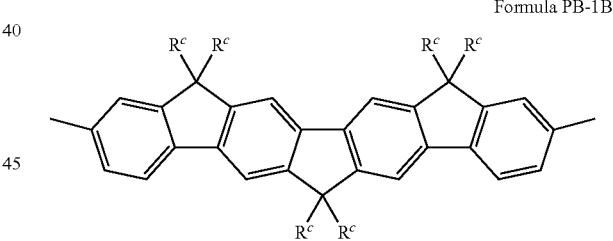

Formula PB-1C

Formula PB-1D

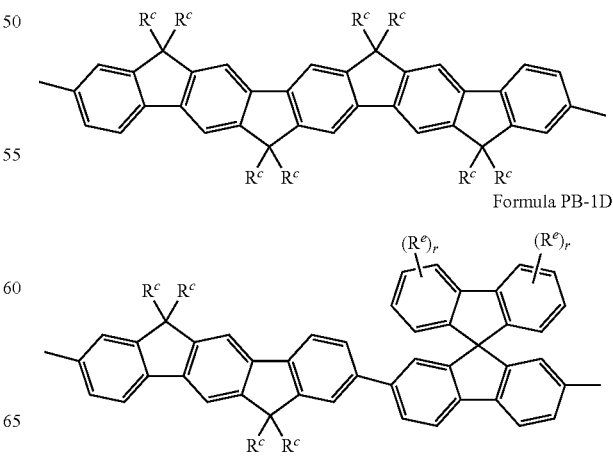

-continued

Formula PB-1E

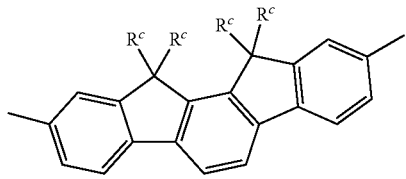

where $R^c$ is as defined above for PB-1, r is 0, 1, 2, 3 or 4, and $R^e$ has the same definition as the $R^c$ radical.

$R^e$ is preferably —F, —Cl, —Br, —I, —CN, —NO$_2$, —NCO, —NCS, —OCN, —SCN, —C(=O)NR$^0$R$^{00}$, —C(=O)X, —C(=O)R$^0$, —NR$^0$R$^{00}$, an optionally substituted silyl, aryl or heteroaryl group having 4 to 40 and preferably 6 to 20 carbon atoms, or a straight-chain, branched or cyclic alkyl, alkoxy, alkylcarbonyl, alkoxycarbonyl, alkylcarbonyloxy or alkoxycarbonyloxy group having 1 to 20 and preferably 1 to 12 carbon atoms, where one or more hydrogen atoms may optionally be replaced by F or Cl, and the $R^0$, $R^{00}$ and X groups have the definition detailed above for formula PB-1.

Particular preference is given to repeat units of the formula PB-1 selected from the group consisting of units of the formulae PB-1F to PB-1I:

Formula PB-1F

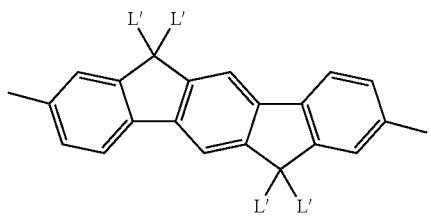

Formula PB-1G

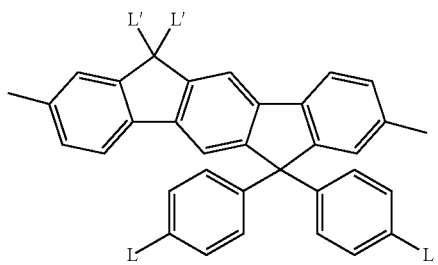

Formula PB-1H

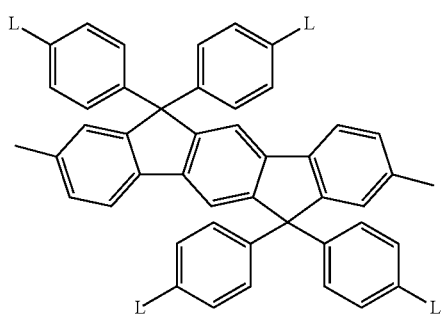

Formula PB-1I

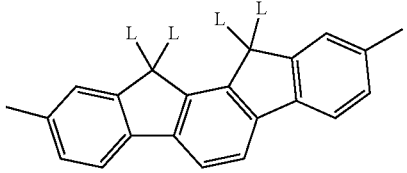

in which the symbols are defined as follows:

L is H, halogen or an optionally fluorinated linear or branched alkyl or alkoxy group having 1 to 12 carbon atoms and is preferably H, F, methyl, i-propyl, t-butyl, n-pentoxy or trifluoromethyl; and L' is an optionally fluorinated linear or branched alkyl or alkoxy group having 1 to 12 carbon atoms and is preferably n-octyl or n-octyloxy.

For performance of the present invention, preference is given to polymers having more than one of the above-detailed structural elements of groups 1 to 7. In addition, it may be the case that, preferably, the polymers have more than one of the above-detailed structural elements from one group, i.e. comprise mixtures of structural elements selected from one group.

Particular preference is given especially to polymers which, as well as at least one structural element having light-emitting properties (group 4), preferably at least one phosphorescent group, additionally comprise at least one further structural element from the above-detailed groups 1 to 3, 5 and 6, in which case these are preferably selected from groups 1 to 3.

The proportion of the various classes of groups, if present in the polymer, may be within wide ranges, these being known to the person skilled in the art. Surprising advantages can be achieved by virtue of the proportion of one class present in any polymer, in each case selected from the above-detailed structural elements of groups 1 to 7, preferably being ≥5 mol % in each case, more preferably ≥10 mol % in each case.

The production of white-emitting copolymers is described in detail inter alia in DE 10343606 A1.

To improve the solubility, the polymers may have appropriate groups. It may preferably be the case that the polymers have substituents, such that an average of at least 2 nonaromatic carbon atoms, more preferably at least 4 and especially preferably at least 8 nonaromatic carbon atoms is present per repeat unit, the average being based on the numerical average. It is possible here for individual carbon atoms to be replaced, for example, by O or S. However, it is possible that a certain proportion and optionally all repeat units have no substituents comprising nonaromatic carbon atoms. Preference is given here to short-chain substituents, since long-chain substituents can have adverse effects on layers which can be obtained using the organic functional materials. Preferably, the substituents have not more than 12 carbon atoms, preferably not more than 8 carbon atoms and more preferably not more than 6 carbon atoms in a linear chain.

A polymer used in accordance with the invention as organic semiconductor material may be a random, alternating or regioregular copolymer, a block copolymer or a combination of these forms of copolymer.

In a further embodiment, a polymer used as organic semiconductor material may be a non-conjugated polymer having side chains, this embodiment being of particular importance for phosphorescent OLEDs based on polymers. In general, phosphorescent polymers can be obtained by free-radical copolymerization of vinyl compounds, where these vinyl compounds contain at least one unit having a phosphorescent emitter and/or at least one charge transport unit, as disclosed inter alia in U.S. Pat. No. 7,250,226 B2. Further phosphorescent polymers are described inter alia in JP 2007/211243 A2, JP 2007/197574 A2, U.S. Pat. No. 7,250,226 B2 and JP 2007/059939 A.

In a further preferred embodiment, the non-conjugated polymers comprise backbone units joined to one another by spacer units. Examples of such triplet emitters based on non-conjugated polymers based on backbone units are disclosed, for example, in DE 102009023154.

In a further preferred embodiment, the non-conjugated polymer may be configured as a fluorescent emitter. Preferred fluorescent emitters based on non-conjugated polymers having side chains include anthracene or benzanthracene groups or derivatives of these groups in the side chain, these polymers being disclosed, for example, in JP 2005/108556, JP 2005/285661 and JP 2003/338375.

These polymers can in many cases be used as electron or hole transport materials, these polymers preferably being configured as non-conjugated polymers.

In addition, the functional compounds used as organic semiconductor material in the formulations, in the case of polymeric compounds, preferably have a molecular weight $M_w$ of ≥10 000 g/mol, more preferably of ≥20 000 g/mol and especially preferably of ≥50 000 g/mol.

The molecular weight $M_w$ of the polymers is preferably in the range from 10 000 to 2 000 000 g/mol, more preferably in the range from 20 000 to 1 000 000 g/mol and most preferably in the range from 50 000 to 300 000 g/mol. The molecular weight $M_w$ is determined by means of GPC (=gel permeation chromatography) against an internal polystyrene standard.

The above-cited documents for description of the organic semiconductor materials are incorporated into the present application by reference for the purposes of disclosure.

The formulations usable in accordance with the invention may contain all organic functional materials needed for production of the particular functional layer of the electronic device. If, for example, a hole transport, hole injection, electron transport or electron injection layer is formed specifically from a functional compound, the formulation comprises specifically this compound as organic functional material. If an emission layer, for example, includes an emitter in combination with a matrix or host material, the formulation comprises, as organic functional material, specifically the mixture of emitter and matrix or host material, as explained in more detail elsewhere in the present application.

The proportion of organic functional material usable for production of functional layers of electronic devices in the formulation is preferably in the range from 0.1% to 20% by weight, more preferably in the range from 0.3% to 10% by weight, and especially preferably in the range from 0.5% to 5% by weight, based on the total weight of the formulation.

As well as the components mentioned, a formulation usable in accordance with the invention may comprise further additives and processing auxiliaries. These include surface-active substances, surfactants, glidants and lubricants, additives which increase conductivity, dispersants, hydrophobizing agents, adhesion promoters, flow improvers, defoamers, deaerating agents, diluents which may be reactive or unreactive, fillers, auxiliaries, processing auxiliaries, dyes, pigments, stabilizers, sensitizers, nanoparticles and inhibitors.

The selection of solvents/dispersants and organic semiconductor can be made in accordance with the purpose and the fields of use, so as to achieve an optimal coating and preferably printing outcome. The absorption material may be selected in accordance with the solvent/dispersant selected and the organic semiconductor chosen, but the absorption material must not lead to unwanted change in the solvent/dispersant or in the organic semiconductor. It is optionally possible to use a polymer material as shell material, as described above, said material being permeable to the impurities but separating the organic semiconductor from the absorption material.

It may also be the case that the weight ratio of absorption material to formulation is in the range from 1:1 to 1:1000, preferably in the range from 1:5 to 1:500, more preferably in the range from 1:10 to 1:100.

The present invention further provides a process for producing a vessel according to the present invention, wherein a vessel is filled with a formulation comprising at least one organic semiconductor and contacted with at least one absorption material.

The present invention further provides for the use of a vessel according to the present invention for production of an electronic device.

An electronic device is understood to mean any device comprising anode, cathode and at least one intervening functional layer, said functional layer comprising at least one organic or organometallic compound.

The organic electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), an organic electrical sensor, a light-emitting electrochemical cell (LEC) or an organic laser diode (O-laser).

Active components are generally the organic or inorganic materials introduced between the anode and cathode, and these active components bring about, maintain and/or improve the properties of the electronic device, for example the performance and/or lifetime thereof, for example charge injection, charge transport or charge blocker materials, but especially emission materials and matrix materials. The organic functional material usable for production of functional layers of electronic devices accordingly preferably comprises an active component of the electronic device.

A preferred embodiment of the present invention is that of organic electroluminescent devices obtainable through use of the vessels of the invention. The organic electroluminescent device comprises cathode, anode and at least one emitting layer.

It is further preferable to use a mixture of two or more triplet emitters together with a matrix. In this case, the triplet emitter having the shorter-wave emission spectrum serves as co-matrix for the triplet emitter having the longer-wave emission spectrum.

The proportion of the matrix material in the emitting layer in this case is between 50% and 99.9% by volume, preferably between 80% and 99.5% by volume, and especially preferably between 92% and 99.5% by volume for fluorescent emitting layers and between 85% and 97% by volume for phosphorescent emitting layers.

Correspondingly, the proportion of the dopant is preferably between 0.1% and 50% by volume, more preferably between 0.5% and 20% by volume, and especially preferably between 0.5% and 8% by volume for fluorescent emitting layers and between 3% and 15% by volume for phosphorescent emitting layers.

An emitting layer of an organic electroluminescent device may also comprise systems comprising a plurality of matrix materials (mixed matrix systems) and/or a plurality of dopants. In this case too, the dopants are generally those materials having the smaller proportion in the system and the matrix materials are those materials having the greater proportion in the system. In individual cases, however, the proportion of a single matrix material in the system may be less than the proportion of a single dopant.

The mixed matrix systems preferably comprise two or three different matrix materials, more preferably two different matrix materials. Preferably, in this case, one of the two materials is a material having hole-transporting properties and the other material is a material having electron-transporting properties. The desired electron-transporting and hole-transporting properties of the mixed matrix components may, however, also be combined mainly or entirely in a single mixed matrix component, in which case the further mixed matrix component(s) fulfil(s) other functions. The two different matrix materials may be present in a ratio of 1:50 to 1:1, preferably of 1:20 to 1:1, more preferably of 1:10 to 1:1 and most preferably of 1:4 to 1:1. Preference is given to using mixed matrix systems in phosphorescent organic electroluminescent devices. Further details of mixed matrix systems can be found, for example, in WO 2010/108579.

Apart from these layers, an organic electroluminescent device may comprise further layers, for example one or more of each of hole injection layers, hole transport layers, hole blocker layers, electron transport layers, electron injection layers, exciton blocker layers, electron blocker layers, charge generation layers (IDMC 2003, Taiwan; Session 21 OLED (5), T. Matsumoto, T. Nakada, J. Endo, K. Mod, N. Kawamura, A. Yokoi, J. Kido, *Multiphoton Organic EL Device Having Charge Generation Layer*) and/or organic or inorganic p/n junctions. At the same time, it is possible that one or more hole transport layers are p-doped, for example with metal oxides such as $MoO_3$ or $WO_3$ or with (per) fluorinated electron-deficient aromatic systems, and/or that one or more electron transport layers are n-doped. It is likewise possible for interlayers to be introduced between two emitting layers, these interlayers having, for example, an exciton-blocking function and/or controlling the charge balance in the electroluminescent device. However, it should be pointed out that not necessarily each of these layers must be present. These layers may likewise be obtained using the formulations usable in accordance with the invention, as defined above.

It may also be the case that one or more layers of an electronic device obtainable in accordance with the invention are produced from solution, for example by spin-coating, or by any printing method, for example screen printing, flexographic printing or offset printing, but more preferably LITI (light-induced thermal imaging, thermal transfer printing) or inkjet printing. Accordingly, the present vessel may preferably be configured in such a way that the corresponding coating apparatus can be contacted with the formulation.

In a manner known per se, according to the application, the device is correspondingly structured, contact-connected and finally hermetically sealed, since the lifetime of such devices is severely shortened in the presence of water and/or air.

The vessels of the invention and electronic devices obtainable therefrom, especially organic electroluminescent devices, are notable for one or more of the following surprising advantages over the prior art 1. The electronic devices obtainable with the vessels of the invention exhibit very high stability and a very long lifetime and excellent quality compared to electronic devices which are obtained with conventional print cartridges, and the properties can be achieved even after a prolonged period of storage or transport of the vessel.
2. The vessels of the invention can be adapted to and processed with conventional printers, such that cost advantages can be achieved in this way too.
3. The vessels of the invention enable safe and reliable transport of formulations which can also be used for production of very fine-structured electronic devices.
4. The vessels of the present invention can be produced inexpensively on known machinery, needing only slight adaptations, if any.

These abovementioned advantages are not accompanied by a deterioration in the further electronic properties.

It should be pointed out that variations of the embodiments described in the present invention are covered by the scope of this invention. Any feature disclosed in the present invention may, unless this is explicitly ruled out, be exchanged for alternative features which serve the same purpose or an equivalent or similar purpose. Thus, any feature disclosed in the present invention, unless stated otherwise, should be considered as an example of a generic series or as an equivalent or similar feature.

All features of the present invention may be combined with one another in any manner, unless particular features and/or steps are mutually exclusive. This is especially true of preferred features of the present invention. Equally, features of non-essential combinations may be used separately (and not in combination).

It should also be pointed out that many of the features, and especially those of the preferred embodiments of the present invention, are themselves inventive and should not be regarded merely as some of the embodiments of the present invention. For these features, independent protection may be sought in addition to or as an alternative to any currently claimed invention.

The technical teaching disclosed with the present invention may be abstracted and combined with other examples.

The present invention is described in detail hereinafter with reference to working examples, but without being restricted thereby.

EXAMPLE 1

Modified Printer Cartridge for the Printing of OLED Materials:

For the printing of OLED components, inkjet methodology is used. For the printing of the individual layers of the desired component, a commercially available industrial inkjet printer from Dimatix is used. The ink is supplied using industry-standard printer cartridges. The cartridges used consist of an outer plastic vessel within which a multilayer film pouch containing the printer ink has been embedded. The multilayer film pouch consists of an inner polyethylene film having a thickness of 100 micrometres, to which a thin aluminium layer of 15 micrometres has been applied, and an outer PET film having layer thickness 40 micrometres, and interlayers to bind the films. A valve in the film pouch can be used to introduce the ink and withdraw it for operation of the printer. The printer cartridges available as industry standard are optimized for the utilization of water-based printing inks and are therefore inadequate to assure the quality of the sensitive materials dissolved in organic solvents for the production of OLED components.

According to the invention, the printer cartridge is modified as follows. In the production of the multilayer film pouch present within the printer cartridge, a metal strip of calcium or lithium or a combination of the two is incorporated. In the preferred execution, a calcium metal strip of thickness 50 μm and width 2 cm is incorporated by lamination between the aluminium layer and the inner PE film of the inner pouch of the cartridge in a dry atmosphere. The film pouch is then manufactured from the film thus processed, in such a way that the calcium strip with the PE film thereon is directed to the inside of the film pouch. The film pouch used had a capacity of 100 milliliters. This film pouch is then, in the customary manner, provided with the valve and incorporated into the printer cartridge and filled with ink.

The cartridge thus modified, filled with an ink mixture, was used to conduct storage tests compared to storage in an unmodified cartridge. For this purpose, two ink mixtures which are utilized for the production of OLED components were used (MHL3-0119 and MBL3-6620 from Merck). Storage was effected at room temperature for 14 months.

The following results were achieved compared to the starting values:

| Ink mixture | Cartridge/storage | Oxygen content | Water content |
|---|---|---|---|
| MHL3-0119 | after production | 100% | 100% |
| | 14 months, unmodified cartridge | 150% | 204% |
| | 14 months, cartridge modified with Ca film | 110% | 111% |
| MBL3-6620 | after production | 100% | 100% |
| | 14 months, unmodified cartridge | 250% | 166% |
| | 14 months, cartridge modified with Ca film | 140% | 108% |

After storage for 14 months at room temperature, the starting values for oxygen content and water content are distinctly exceeded in the unmodified printer cartridge. The modification of the cartridge in accordance with the invention causes the rise in oxygen and water content to be much smaller.

EXAMPLE 2

Modified Reservoir Vessels for Inks in Organic Electronics and for Organic Solar Cells:

In the production of components in organic electronics or solar cells, containers of the Nowpak brand (Entegris) have become established. The containers are metal flasks provided with an inliner film pouch made of PTFE. Such a flask is modified in accordance with the invention in such a way that an absorber material is introduced into the interspace between the inner wall of the metal flask and the PTFE film pouch. The amount of the absorber material should be about 1% by weight of the contents of the vessel. The absorption material is produced by vigorously mixing a commercially available dried silica gel with a calcium powder in a ratio of 10:1 in a dry atmosphere in a glovebox. Immediately after production, the absorber material thus produced is introduced under a dry atmosphere into the interspace between the metal wall and inliner pouch of the flask to be modified. In the example, a flask having a capacity of 1000 ml (flask of the Nowpak brand from Entegris) was used.

The flask that has been modified in this way, prior to filling, is stored in a dry atmosphere in a glovebox and then filled with the desired ink in the customary manner and examined. The flask thus modified can then be used in a customary manner in unchanged form for the production of components for organic electronics, of OLED components or organic solar cells, for example by means of spin-coating.

In the example, an ink consisting of a hole transport material (HTM-081, Merck) dissolved in a concentration of 5 grams per litre in toluene was used. The mixture was produced in a dry atmosphere in a glovebox and, after production, had an oxygen content of <4 ppm and a water content of <200 ppm, measured by Karl Fischer titration.

After the filling of the flask modified by means of absorbers with 1000 ml of ink solution, the flask was first stored outside the glovebox at room temperature for one week and then for 2 months. One week after the filling, the water content measured in the samples fell by 10-20%. The oxygen content remained below the detection limit of 4 ppm. After storage for a further two months, no detectable rise in respect of water and oxygen content was observable.

EXAMPLE 3

Supply Vessel for the Printing of Organic Functional Inks and OLED Inks

For use in large production plants, for the supply of inks, a stainless steel vessel having a vessel volume of 1 to 200 litres or even greater was used. As an example, a 30 litre stainless steel vessel was used. The vessel has a lid screwed onto the vessel with a seal. This lid has been provided not only with a safety valve and optionally measurement devices but also with two pipe leadthroughs each having a diameter of 10 mm in the example, equipped with stainless steel pipes. One pipe reaches to just above the base of the vessel and serves for withdrawal of the liquid from the vessel. The second pipe ends just below the lid and allows the filling of the vessel. The two pipes are each sealed with a valve above the lid and are provided with connections which can be attached to the standard filling or withdrawal devices. According to the invention, an absorber material is introduced into this supply vessel. In Example 3a), the absorber material is introduced into a porous PTFE pouch. The maximum pore size of the PTFE used for the pouch should be 100 nm. The pouch is filled with the absorber material in a dry atmosphere and sealed, and, after the cleaning and drying of the supply vessel, inserted into the vessel in the dry state, before the lid of the vessel is mounted together with the filling and withdrawal pipe. Thereafter, the ink is introduced and thus comes into direct contact with the pouch comprising the absorber material and can also penetrate the latter because of its porosity. Thus, the absorber material comes into direct contact with the printing ink introduced.

In Example 3b), the absorber material is introduced in another way. The absorber material is introduced into a stainless steel pipe which, after being filled, is sealed with a membrane filter at either end. The pipe comprising absorber material is connected to the filling tube in the vessel in the dry state, such that the ink flows into the tube comprising the absorber material during the filling at first via the filling pipe and the first of the two membrane filters, in order then to pass through the second filter into the remaining inner volume of the vessel. During the filling, the ink introduced flows all the way around the pipe comprising the absorber material, and the pipe remains in contact with the ink during the storage and transport. Membrane filters used are commercially available membrane filters from Entegris. The absorber material used is ultrapure alumina, for example in an amount of 8% by weight, based on the fill volume of the vessel. The vessel is filled with a hole conductor ink as used for the production of OLEDs or else for components for organic electronics. In the example, a Merck ink with the name MHL3-0119 was used. After preparation of the vessels as described in Examples 3a) and 3b), the vessels were each filled with 30 litres of the ink.

After the filling and after a storage time of 2 months, the water content of the ink was determined and compared to the starting value. The following results were achieved:

| Storage time | Water content in the vessel according to Example 3a) | Water content in the vessel according to Example 3b) |
| --- | --- | --- |
| Before filling | 120 ppm | 120 ppm |
| Immediately after filling | not determined | 40 ppm |
| One week after filling | 52 ppm | not determined |
| After storage time of 2 months | 60 ppm | 57 ppm |

After a prolonged storage time of up to 6 months, no significant rise in the water content beyond the measurement accuracy of the Karl Fischer test method used was observed.

The invention claimed is:

1. An ink reservoir vessel comprising a formulation including one or more organic semiconductors dissolved or dispersed in a solvent or dispersant, wherein the formulation is in contact with at least one absorption material.

2. The ink reservoir vessel according to claim 1, wherein the absorption material can bind oxygen, water and/or hydroxide ions or can react with these substances.

3. The ink reservoir vessel according to claim 1, wherein the absorption material is selected from alkali metals or alkaline earth metals.

4. The ink reservoir vessel according to claim 1, wherein the absorption material takes the form of a film, a powder, a granular material, having particle sizes in the range from 1 μm to 5 mm, and/or of a shaped body.

5. The ink reservoir vessel according to claim 1, wherein the absorption material is porous or particulate.

6. The ink reservoir vessel according to claim 1, wherein the absorption material is in direct contact with the formulation.

7. The ink reservoir vessel according to claim 1, wherein the absorption material has been embedded into a polymer material.

8. The ink reservoir vessel according to claim 7, wherein the polymer film surrounds the absorption material, such that the polymer film forms a pouch, container or shell within which the absorption material is present.

9. The ink reservoir vessel according to claim 7, wherein the polymer material or polymer film contains the absorption material in such a way that polymer material and absorption material are in a mixture and the absorption material is homogeneously distributed in the polymer film or polymer material.

10. The ink reservoir vessel according to claim 7, wherein the polymer material is a polymer film which has a permeability with respect to oxygen, water and/or hydroxide ions of at least 0.001 g/(m$^2$ d) (grams per square metre and day), measured by means of diffusion measurement.

11. The ink reservoir vessel according to claim 7, wherein the weight ratio of absorption material to polymer material, preferably polymer film, is in the range from 500:1 to 1:500.

12. The ink reservoir vessel according to claim 1, wherein the vessel is a printer cartridge.

13. The ink reservoir vessel according to claim 12, wherein the printer cartridge has a housing into which there has been introduced an inner pouch within which the formulation including at least one organic semiconductor is present.

14. The ink reservoir vessel according to claim 13, wherein the inner pouch is formed from a multilayer film impermeable to oxygen, water, carbon dioxide and/or hydroxide ions.

15. The ink reservoir vessel according to claim 12, wherein a layer comprising an absorption material has been applied at least to part of the inner surface of the inner pouch and/or the absorption material has been introduced into an inner layer of the inner pouch.

16. The ink reservoir vessel according to claim 12, wherein the printer cartridge has a valve, with the absorption material fixed close to the valve.

17. The ink reservoir vessel according to claim 1, wherein the organic semiconductor is selected from host materials, matrix materials, electron transport materials, electron injection materials, hole conductor materials, hole injection materials, electron blocker materials and hole blocker materials.

18. A process for producing the ink reservoir vessel according to claim 1, wherein a vessel is filled with a formulation comprising at least one organic semiconductor and contacted with at least one absorption material.

19. The ink reservoir vessel according to claim 1, wherein the absorption material is selected from aluminum oxide, titanium oxide, zirconium oxide, silicon oxide, zeolites, silica gels or aluminosilicates; or zirconium, vanadium, cobalt, iron, manganese, copper or zinc, or the oxides thereof, and combinations, mixtures or alloys of these materials.

* * * * *